(12) United States Patent
Lee et al.

(10) Patent No.: US 12,154,873 B2
(45) Date of Patent: Nov. 26, 2024

(54) SEMICONDUCTOR PACKAGE INCLUDING ANTENNA

(71) Applicant: Samsung Electronics Co., Ltd., Suwon-si (KR)

(72) Inventors: Yongkoon Lee, Suwon-si (KR); Jingu Kim, Suwon-si (KR); Sangkyu Lee, Suwon-si (KR); Seokkyu Choi, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/125,989

(22) Filed: Mar. 24, 2023

(65) Prior Publication Data

US 2023/0230943 A1 Jul. 20, 2023

Related U.S. Application Data

(63) Continuation of application No. 17/206,252, filed on Mar. 19, 2021, now Pat. No. 11,637,079.

(30) Foreign Application Priority Data

Aug. 14, 2020 (KR) .......................... 10-2020-0102714

(51) Int. Cl.
*H01L 23/66* (2006.01)
*H01L 21/48* (2006.01)
(Continued)

(52) U.S. Cl.
CPC .......... *H01L 23/66* (2013.01); *H01L 21/4853* (2013.01); *H01L 21/4857* (2013.01);
(Continued)

(58) Field of Classification Search
CPC ............. H01L 21/4853; H01L 21/4857; H01L 21/565; H01L 21/568; H01L 21/6835;
(Continued)

(56) References Cited

U.S. PATENT DOCUMENTS 9,362,234 B2 6/2016 Pabst et al.
10,276,920 B2 4/2019 Hsiao et al.
(Continued)

*Primary Examiner* — Eliseo Ramos Feliciano
*Assistant Examiner* — Christina A Sylvia
(74) *Attorney, Agent, or Firm* — Muir Patent Law, PLLC

(57) ABSTRACT

A semiconductor package includes a supporting wiring structure including a first redistribution dielectric layer and a first redistribution conductive structure; a frame on the supporting wiring structure, having a mounting space and a through hole, and including a conductive material; a semiconductor chip in the mounting space and electrically connected to the first redistribution conductive structure; a cover wiring structure on the frame and the semiconductor chip and including a second redistribution dielectric layer and a second redistribution conductive structure; an antenna structure on the cover wiring structure; a connection structure extending in the through hole and electrically connecting the first redistribution conductive structure to the second redistribution conductive structure; and a dielectric filling member between the connection structure in the through hole and the frame and surrounding the semiconductor chip, the frame, and the connection structure.

20 Claims, 21 Drawing Sheets

(51) Int. Cl.
| | |
|---|---|
| *H01L 21/56* | (2006.01) |
| *H01L 21/683* | (2006.01) |
| *H01L 23/00* | (2006.01) |
| *H01L 23/31* | (2006.01) |
| *H01L 23/538* | (2006.01) |
| *H01Q 9/04* | (2006.01) |
| *H01Q 19/00* | (2006.01) |

(52) U.S. Cl.
CPC .......... *H01L 21/565* (2013.01); *H01L 21/568* (2013.01); *H01L 21/6835* (2013.01); *H01L 23/3121* (2013.01); *H01L 23/5383* (2013.01); *H01L 23/5386* (2013.01); *H01L 23/5389* (2013.01); *H01L 24/19* (2013.01); *H01L 24/20* (2013.01); *H01Q 9/0407* (2013.01); *H01Q 19/005* (2013.01); *H01L 2221/68372* (2013.01); *H01L 2223/6677* (2013.01); *H01L 2224/214* (2013.01)

(58) Field of Classification Search
CPC . H01L 23/3121; H01L 23/66; H01L 23/5383; H01L 23/5386; H01L 23/5389; H01L 23/5385; H01L 23/485; H01L 23/528; H01L 23/525; H01L 24/19; H01L 24/20; H01L 2221/68372; H01L 2223/6677; H01Q 9/0407; H01Q 19/005; H01Q 1/523; H01Q 1/243
See application file for complete search history.

(56) References Cited

U.S. PATENT DOCUMENTS

| | | | |
|---|---|---|---|
| 10,354,964 | B2 | 7/2019 | Yu et al. |
| 10,490,479 | B1 | 11/2019 | Wan et al. |
| 10,511,080 | B2 | 12/2019 | So et al. |
| 10,580,761 | B2 | 3/2020 | Cheah et al. |
| 2015/0294896 | A1* | 10/2015 | Hurwitz ................ H01L 25/042 438/15 |
| 2017/0162476 | A1 | 6/2017 | Meyer et al. |
| 2017/0346185 | A1 | 11/2017 | Wang et al. |
| 2019/0207304 | A1* | 7/2019 | Kim ........................ H01L 24/25 |
| 2019/0378801 | A1 | 12/2019 | Leitgeb et al. |
| 2020/0013735 | A1 | 1/2020 | Liu et al. |
| 2020/0035607 | A1 | 1/2020 | Lee et al. |
| 2020/0075503 | A1 | 3/2020 | Chuang et al. |
| 2020/0365517 | A1 | 11/2020 | Lin et al. |
| 2021/0013585 | A1 | 1/2021 | Ho et al. |

* cited by examiner

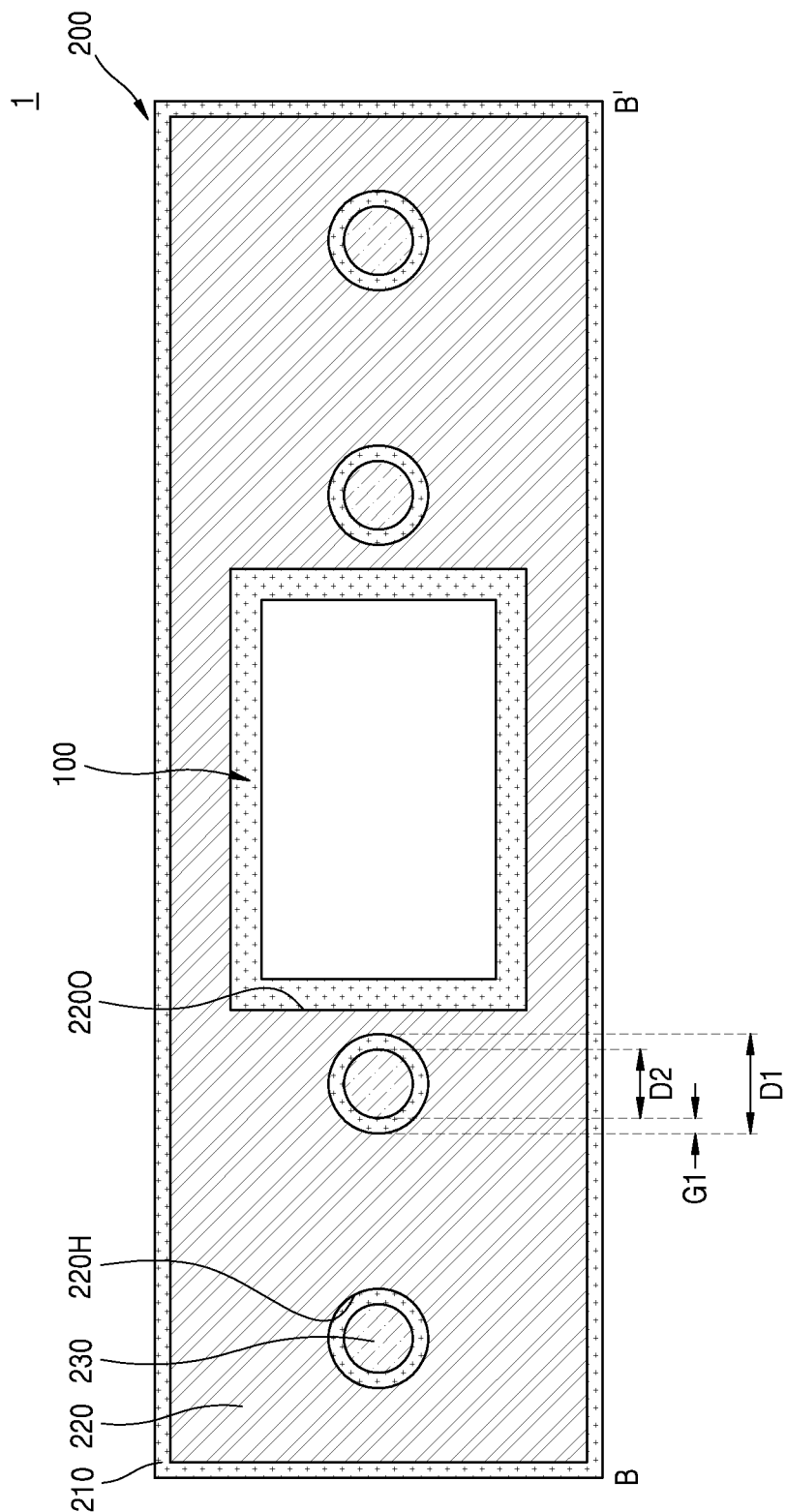

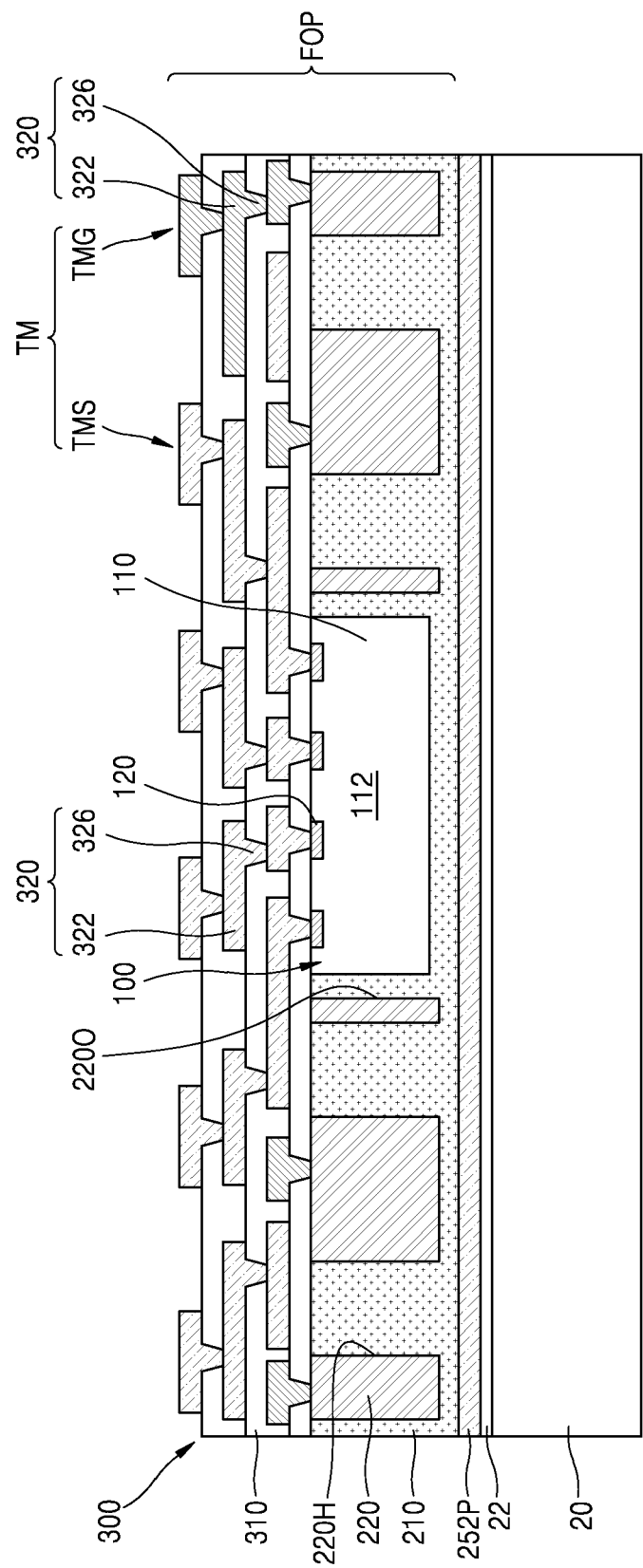

SEMICONDUCTOR PACKAGE INCLUDING ANTENNA

CROSS-REFERENCE TO RELATED APPLICATIONS

This application is a continuation of U.S. application Ser. No. 17/206,252, filed Mar. 19, 2021, in the U.S. Patent and Trademark Office, which is based on and claims priority under 35 U.S.C. § 119 to Korean Patent Application No. 10-2020-0102714, filed on Aug. 14, 2020, in the Korean Intellectual Property Office, the disclosures of both of which are incorporated by reference herein in their entireties.

BACKGROUND

The inventive concept relates to a semiconductor package, and more particularly, to a semiconductor package including an antenna.

With the rapid increase in demand for portable devices in the recent electronic products market, electronic components mounted on electronic products have continuously been required to be compact and light. To make electronic components compact and light, a semiconductor package mounted on the electronic components is required to be small in volume and to have various functions. Therefore, an integrated semiconductor package having a semiconductor chip and other components mounted together therein is being developed.

SUMMARY

The inventive concept provides an integrated semiconductor package including an antenna and a semiconductor chip.

According to an aspect of the inventive concept, there is provided a semiconductor package including a supporting wiring structure including a first redistribution dielectric layer and a first redistribution conductive structure; a frame on the supporting wiring structure, the frame having a mounting space and a through hole, and including a conductive material; a semiconductor chip in the mounting space and electrically connected to the first redistribution conductive structure; a cover wiring structure on the frame and the semiconductor chip and including a second redistribution dielectric layer and a second redistribution conductive structure; an antenna structure on the cover wiring structure; a connection structure extending in the through hole and electrically connecting the first redistribution conductive structure to the second redistribution conductive structure; and a dielectric filling member between the connection structure in the through hole and the frame and surrounding the semiconductor chip, the frame, and the connection structure.

According to another aspect of the inventive concept, there is provided a semiconductor package including a supporting wiring structure including a redistribution dielectric layer and a redistribution conductive structure; an expansion layer including a frame on the supporting wiring structure, a dielectric filling member, and a connection structure, the frame having a mounting space and a through hole and being grounded through the redistribution conductive structure, the dielectric filling member filling the mounting space and the through hole and surrounding the frame, and the connection structure extending in the through hole and being electrically connected to the redistribution conductive structure; a semiconductor chip in the mounting space and including a radio-frequency integrated circuit (RFIC) electrically connected to the redistribution conductive structure; and an antenna part on the expansion layer, the antenna part exchanging signals with the semiconductor chip through the connection structure, wherein the connection structure, a portion of the frame adjacent to the through hole, and a portion of the dielectric filling member form a signal transmission line having a coaxial structure, the portion of the dielectric filling member being between the connection structure in the through hole and the frame and surrounding the connection structure in a ring shape.

According to a further aspect of the inventive concept, there is provided a semiconductor package including a supporting wiring structure including a first redistribution dielectric layer and a first redistribution conductive structure; an expansion layer including a frame on the supporting wiring structure, a dielectric filling member, and a plurality of connection structures, the frame having a mounting space and a plurality of through holes and including a conductive material grounded through the first redistribution conductive structure, the dielectric filling member filling the mounting space and the plurality of through holes and surrounding the frame, and the plurality of connection structures respectively extending in the plurality of through holes and including a material having a higher electrical conductivity than the frame; a semiconductor chip in the mounting space and including an RFIC electrically connected to the first redistribution conductive structure; a cover wiring structure on the expansion layer and including a second redistribution dielectric layer and a second redistribution conductive structure; and an antenna structure on the cover wiring structure and forming a patch antenna together with at least a portion of the cover wiring structure, wherein the plurality of connection structures are electrically connected to the first redistribution conductive structure and the second redistribution conductive structure and transmit a signal between the patch antenna and the semiconductor chip; and each of the plurality of connection structures, a portion of the frame adjacent to each of the plurality of through holes, and a portion of the dielectric filling member form a signal transmission line having a coaxial structure, the portion of the dielectric filling member being between each of the plurality of connection structures in a corresponding one of the plurality of through holes and the frame and surrounding each of the plurality of connection structures in a ring shape.

BRIEF DESCRIPTION OF THE DRAWINGS

Embodiments of the inventive concept will be more clearly understood from the following detailed description taken in conjunction with the accompanying drawings in which like numerals refer to like elements throughout. In the drawings:

FIGS. 1A through 1C are cross-sectional views of a semiconductor package according to example embodiments, wherein FIGS. 1B and 1C are cross-sectional views respectively taken along lines B-B' and C-C' in FIG. 1A;

FIGS. 2A through 2H are cross-sectional views of stages in a method of manufacturing a semiconductor package, according to example embodiments;

FIGS. 6A and 6B are cross-sectional views of a semiconductor package according to example embodiments, wherein FIG. 6B is a cross-sectional view taken along line D-D' in FIG. 6A;

DETAILED DESCRIPTION OF THE EMBODIMENTS

Herein, spatially relative terms, such as "beneath," "below," "lower," "above," "upper" and the like, may be used for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 1A:
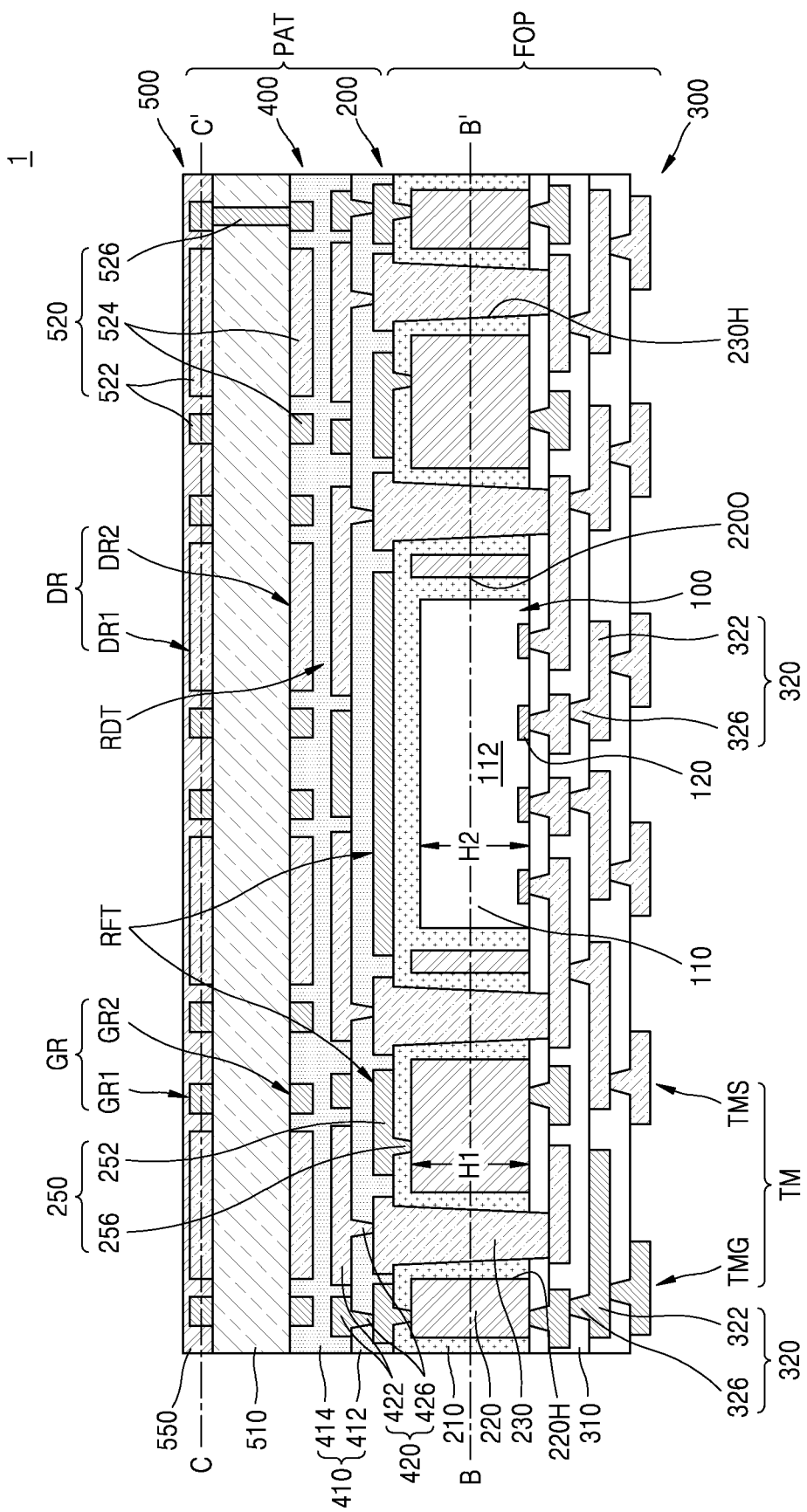
Figure 1C:
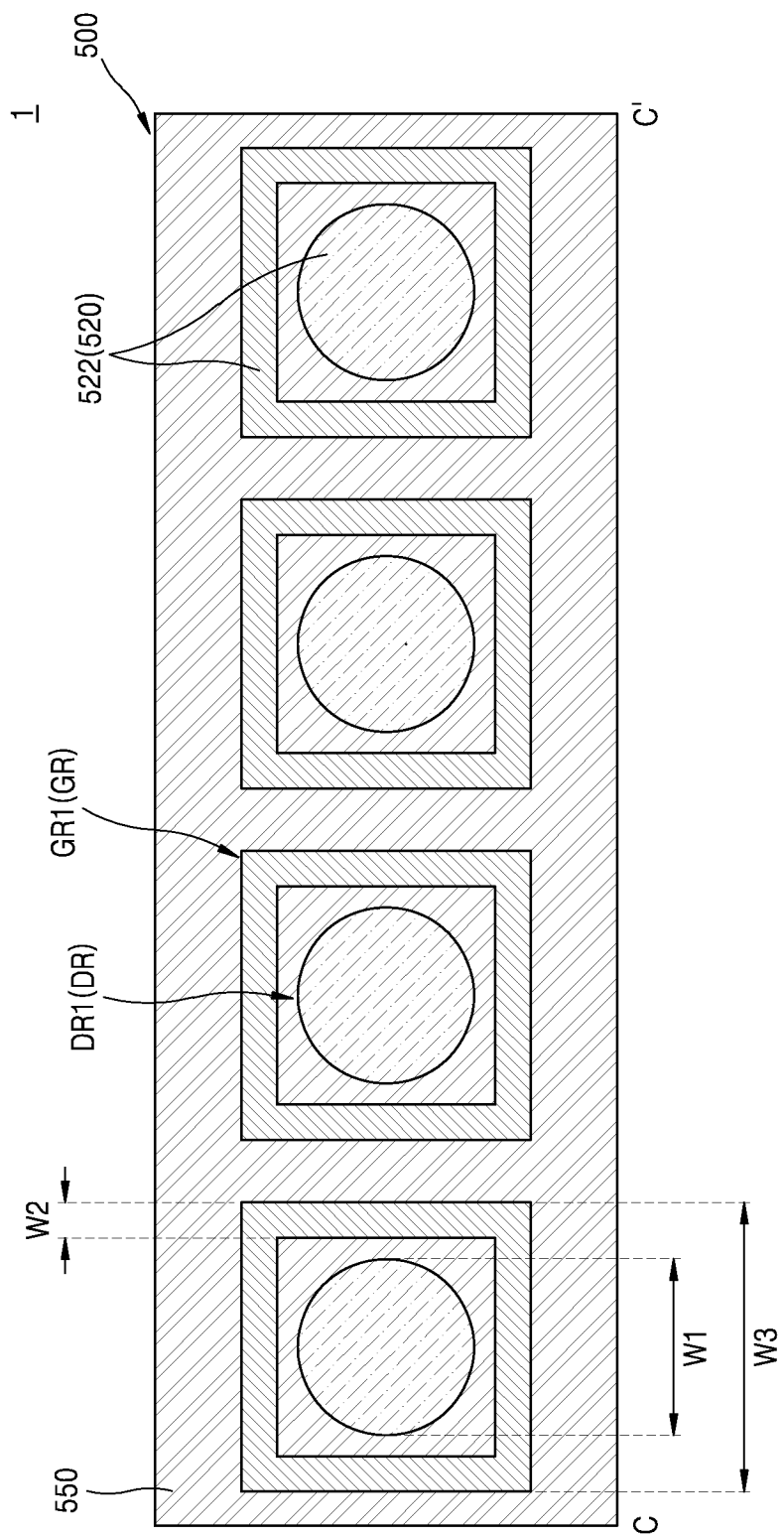

FIGS. 1A through 1C are cross-sectional views of a semiconductor package according to example embodiments, wherein FIGS. 1B and 1C are cross-sectional views respectively taken along lines B-B' and C-C' in FIG. 1A.

Referring to FIGS. 1 through 1C, a semiconductor package 1 may include a fan-out package part FOP and an antenna part PAT. The fan-out package part FOP may include a semiconductor chip 100. The semiconductor package 1 may include an integrated semiconductor package including the semiconductor chip 100 of the fan-out package part FOP together with a patch antenna formed by the antenna part PAT. The patch antenna formed by the antenna part PAT may include a director DR, a radiator RDT, and a reflector RFT.

The semiconductor package 1 may include a supporting wiring structure 300, an expansion layer 200 on the supporting wiring structure 300, the semiconductor chip 100 in the expansion layer 200, a cover wiring structure 400 on the semiconductor chip 100 and the expansion layer 200, and an antenna structure 500 on the cover wiring structure 400. The semiconductor package 1 includes one semiconductor chip 100 in FIGS. 1A and 1B. However, this is just an example, and embodiments are not limited thereto. In some embodiments, the semiconductor package 1 may include a plurality of semiconductor chips 100.

The supporting wiring structure 300, the expansion layer 200, and at least a portion of the cover wiring structure 400 may form the fan-out package part FOP. At least a portion of the cover wiring structure 400 and the antenna structure 500 may form the antenna part PAT. The fan-out package part FOP and the antenna part PAT may share the cover wiring structure 400 with each other.

The semiconductor package 1 may include a fan-out semiconductor package, in which the horizontal width and plane area of each of the supporting wiring structure 300 and the cover wiring structure 400 are respectively greater than the horizontal width and plane area of a footprint of the semiconductor chip 100. For example, the semiconductor package 1 may include a fan-out panel level package (FOPLP).

For example, when the semiconductor package 1 includes one semiconductor chip 100, the horizontal width and plane area of each of the supporting wiring structure 300 and the cover wiring structure 400 each may be greater than the horizontal width and plane area of the semiconductor chip 100. In some embodiments, the horizontal width and plane area of the supporting wiring structure 300 may be the same as the horizontal width and plane area of the cover wiring structure 400. In some embodiments, respective side surfaces of the supporting wiring structure 300, the expansion layer 200, and the cover wiring structure 400 may be coplanar with one another. Terms such as "same," "equal," "planar," or "coplanar," as used herein, encompass near identicality including variations that may occur, for example, due to manufacturing processes. The term "substantially" may be used herein to emphasize this meaning, unless the context or other statements indicate otherwise.

The supporting wiring structure 300 may include a first redistribution dielectric layer 310 and a first redistribution conductive structure 320. For example, the supporting wiring structure 300 may correspond to a redistribution layer. In some embodiments, the supporting wiring structure 300 may include a plurality of first redistribution dielectric layers 310, which are stacked on each other. The first redistribution dielectric layer 310 and the first redistribution conductive structure 320 may be respectively referred to as a first base dielectric layer and a first wiring pattern. For example, the first redistribution dielectric layer 310 may be formed from a photo-imageable dielectric (PID) or photosensitive polyimide (PSPI). For example, the first redistribution conductive structure 320 may include a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof but are not limited thereto. In some embodiments, the first redistribution conductive structure 320 may include a stack of a metal or a metal alloy on a seed layer including titanium, titanium nitride, or titanium tungsten.

The first redistribution conductive structure 320 may include a plurality of first redistribution line patterns 322 on at least one of a top surface and a bottom surface of the first redistribution dielectric layer 310 and a plurality of first redistribution vias 326 passing through the first redistribution dielectric layer 310 and respectively contacting some of the first redistribution line patterns 322. In some embodiments, at least some of the first redistribution line patterns 322 may be integrally formed with some of the first redistribution vias 326. For example, a first redistribution line pattern 322 may be integrally formed with a first redistribution via 326 contacting the top surface of the first redistribution line pattern 322. As used herein, the term "integrally formed" may refer to structures, patterns, and/or layers that are formed at the same time and of the same material, without a break in the continuity of the material of which they are formed.

In some embodiments, each of the first redistribution vias 326 may have a tapered shape having a horizontal width decreasing away from the bottom thereof toward the top thereof. In other words, the horizontal width of each of the first redistribution vias 326 may increase away from the semiconductor chip 100.

Some of the first redistribution line patterns 322 at the bottom of the first redistribution conductive structure 320 may function as an external connection terminal TM. The external connection terminal TM may include a signal terminal TMS and a ground terminal TMG. A data signal, a control signal, or power may be provided to the signal terminal TMS. The ground terminal TMG may be grounded.

In this specification, among the first redistribution conductive structure 320 of the supporting wiring structure 300, a second redistribution conductive structure 420 of the cover wiring structure 400, and an antenna conductive structure 520 of the antenna structure 500, portions having the same hatch pattern as the ground terminal TMG may be grounded or may electrically float.

The semiconductor chip 100 may include a semiconductor substrate 110, which has a semiconductor device 112 on an active side thereof, and a plurality of chip connection pads 120 on the active side of the semiconductor substrate 110.

For example, the semiconductor substrate 110 may include a semiconductor material such as silicon (Si). Alternatively, the semiconductor substrate 110 may include a semiconductor element, e.g., germanium (Ge), or a compound semiconductor such as silicon carbide (SiC), gallium arsenide (GaAs), indium arsenide (InAs), or indium phosphide (InP). The semiconductor substrate 110 may include a conductive region, e.g., an impurity-doped well. The semiconductor substrate 110 may have various isolation structures including a shallow trench isolation (STI) structure.

The semiconductor device 112 may include various kinds of individual devices in the active side of the semiconductor substrate 110. The individual devices may include various microelectronic devices, e.g., a metal-oxide-semiconductor field effect transistor (MOSFET) such as a complementary metal-oxide-semiconductor (CMOS) transistor, a system large scale integration (LSI), an image sensor such as a CMOS image sensor (CIS), a micro-electro-mechanical system (MEMS), an active element, and a passive element. The individual devices may be electrically connected to the conductive region of the semiconductor substrate 110. The semiconductor device 112 may further include a conductive wiring or plug, which electrically connects the individual devices or at least two individual devices to the conductive region of the semiconductor substrate 110. Each of the individual devices may be electrically isolated from other individual devices by a dielectric film.

In some embodiments, the semiconductor chip 100 may be a communication chip and may include a signal processing circuit that processes radio signals. For example, the semiconductor chip 100 may include a radio-frequency integrated circuit (RFIC). In some embodiments, the semiconductor chip 100 may include an RFIC for wavelengths of about 10 mm to about 1 mm and mmWave having a wavelength close to those wavelengths. For example, the semiconductor chip 100 may include an RFIC for a frequency band of about 30 GHz to about 300 GHz and an adjacent frequency band, e.g., a frequency band of 28 GHz. The antenna part PAT may transmit and receive mmWave radio signals.

In some embodiments, when the semiconductor package 1 includes a plurality of semiconductor chips 100, at least one of the semiconductor chips 100 may be a communication chip and the other ones may include at least one selected from a central processing unit (CPU) chip, an application processor (AP) chip, a dynamic random access memory (DRAM) chip, a static RAM (SRAM) chip, a flash memory chip, an electrically erasable and programmable ROM (EE-PROM) chip, a phase-change RAM (PRAM) chip, a magnetic RAM (MRAM) chip, and a resistive RAM (RRAM) chip.

The semiconductor chip 100 may be mounted on the supporting wiring structure 300 in a flip-chip manner. In other words, the semiconductor chip 100 may be mounted on the supporting wiring structure 300 such that the active side of the semiconductor substrate 110 faces the supporting wiring structure 300. The active side may be the side on which devices are formed.

The chip connection pads 120 of the semiconductor chip 100 may be electrically connected to the semiconductor device 112 and to the first redistribution conductive structure 320 of the supporting wiring structure 300. In some embodiments, a portion of a first redistribution line pattern 322 in a top wiring layer among a plurality of first redistribution line patterns 322 may be in contact with each of the chip connection pads 120, but embodiments are not limited thereto. In some embodiments, some of first redistribution vias 326 in the top wiring layer among a plurality of first redistribution vias 326 may be respectively in contact with the chip connection pads 120.

The wiring layer refers to an electrical path extending on a plane. The supporting wiring structure 300 may have a wiring layer in each of the top and bottom surfaces of the first redistribution dielectric layer 310. Accordingly, the wiring layers of the supporting wiring structure 300 may be one more than the number of first redistribution dielectric layers 310 of the supporting wiring structure 300.

The expansion layer 200 may include a dielectric filling member 210, a frame 220, a plurality of connection structures 230, and an expansion conductive structure 250. The frame 220 may include at least one mounting space 2200 and a plurality of through holes 220H. For example, the mounting space 2200 and the through holes 220H may pass from a top surface of the frame 220 to a bottom surface of the frame 220. In some embodiments, the mounting space 2200 and the through holes 220H may respectively have inner side surfaces, which have substantially the same plane area and substantially extend in a vertical direction passing from the top surface to the bottom surface of the frame 220.

The semiconductor chip 100 may be located in the mounting space 2200. The connection structures 230 may respectively extend in the through holes 220H.

For example, the horizontal cross-section of the mounting space 2200 may be square or rectangular. In some embodiments, the horizontal width and plane area of the mounting space 2200 may be respectively greater than the horizontal width and plane area of the footprint of the semiconductor chip 100. A side surface of the semiconductor chip 100 may be separated from the inner side surface of the mounting space 2200. For example, the side surfaces of the semiconductor chip 100 may be spaced apart from the inner side surface of the mounting space 2200.

For example, the horizontal cross-section of each of the through holes 220H may be a circle or a near-circular ellipse. In some embodiments, the horizontal width and plane area of each of the through holes 220H may be respectively greater than the horizontal width and plane area of the footprint of a corresponding one of the connection structures 230. A side surface of each of the connection structures 230 may be separated from the inner side surface of a corresponding one of the through holes 220H. Each through hole 220H may have a first horizontal width D1, and each connection structure 230 may have a second horizontal width D2. The first horizontal width D1 may be greater than the second horizontal width D2. The first horizontal width D1 may be substantially constant from the top to bottom of the through hole 220H. The second horizontal width D2 may decrease away from a top surface of the connection structure 230 toward a bottom surface thereof. The through hole 220H may be separated from the connection structure 230 by a first gap G1. In some embodiments, the first horizontal width D1 may be about 100 µm to about 250 µm, the second horizontal width D2 may be about 40 µm to about 70 µm, and a horizontal width of the first gap G1 may be about 30 µm to about 80 µm.

The connection structure 230 may extend in the through hole 220H of the frame 220 and may fill a connection hole 230H, which passes through the dielectric filling member 210. Accordingly, the dielectric filling member 210 is in the through hole 220H and is between the connection structure 230 and the frame 220. The dielectric filling member 210 may contact an outer side surface of the connection structure 230 and an inner side surface of the frame 220. The dielectric filling member 210 may have a horizontal width corresponding to the horizontal width of the gap G1. The connection structure 230 may electrically connect the first redistribution conductive structure 320 to the second redistribution conductive structure 420. The connection structure 230 may be electrically connected to the semiconductor chip 100 through the first redistribution conductive structure 320.

In some embodiments, the connection structure 230 may have a tapered shape having a horizontal width decreasing away from the top thereof toward the bottom thereof. In other words, the connection structure 230 may extend with the horizontal width thereof decreasing from the cover wiring structure 400 toward the supporting wiring structure 300.

The frame 220 may be grounded, and the connection structure 230 may include a material having a higher electrical conductivity than the frame 220. A portion of the frame 220 adjacent to the through hole 220H and a portion of the dielectric filling member 210, which is in the through hole 220H and is between the frame 220 and the connection structure 230, may surround the connection structure 230 in a ring shape. Accordingly, the connection structure 230, the portion of the frame 220, which is adjacent to the through hole 220H and is grounded, and the portion of the dielectric filling member 210 between the frame 220 and the connection structure 230 may form a low-loss signal transmission line having a coaxial structure similar to a coaxial cable. Accordingly, a loss in a mmWave signal, which is transmitted or received by the antenna part PAT and may undergo a relatively large loss, may be minimized while the mmWave signal is being transmitted between the antenna part PAT and the semiconductor chip 100 through the connection structure 230.

The dielectric filling member 210 may surround the semiconductor chip 100, the frame 220, and a plurality of connection structures 230. The dielectric filling member 210 may fill a space between the semiconductor chip 100 and the inner side surface of the mounting space 2200 and a space between each of the connection structures 230 and the inner side surface of a corresponding one of the through holes 220H and may cover at least a portion of the top surface of the frame 220. For example, the dielectric filling member 210 may include thermosetting resin such as epoxy resin, thermoplastic resin such as polyimide, resin containing a stiffener such as an inorganic filler, an Ajinomoto build-up film (ABF), a frame retardant 4 (FR-4), bismaleimide triazine (BT), PID resin, an epoxy molding compound (EMC), or photo-imageable encapsulant (PIE).

The frame 220 may include a conductive material such as a metal or a metal alloy. For example, the frame 220 may include a metal, such as Cu, iron (Fe), Ni, Mn, Co, or silver (Ag), or an alloy thereof. In some embodiments, the frame 220 may include an iron-nickel alloy. For example, the frame 220 may include at least one mounting space 2200 and a plurality of through holes 220H using a similar method to a method of manufacturing a lead frame. The frame 220 may be electrically connected to a portion of the first redistribution conductive structure 320 connected to the ground terminal TMG. The frame 220 may be grounded. The frame 220 may emit heat to the outside, wherein the heat is generated by the semiconductor chip 100 and the connection structures 230.

The connection structures 230 may include a material having a higher electrical conductivity than the frame 220. For example, the connection structures 230 may include Cu or a Cu alloy but is not limited thereto.

The frame 220 may have a first height H1, and the semiconductor chip 100 may have a second height H2. The first height H1 may be greater than the second height H2. For example, the first height H1 may be about 60 µm to about 100 µm, and the second height H2 may be about 50 µm to about 80 µm.

The bottom surface of the frame 220 may be at the same vertical level as the bottom surface of the semiconductor chip 100. The top surface of the frame 220 may be at a higher vertical level than the top surface of the semiconductor chip 100. In some embodiments, the bottom surface of the dielectric filling member 210, the bottom surface of the frame 220, and the bottom surface of the semiconductor chip 100 may be coplanar with one another at the same vertical level.

In some embodiments, the bottom surface of each of the connection structures 230 may be at a lower vertical level than the bottom surface of the frame 220, and the top surface of each of the connection structures 230 may be at a higher vertical level than the top surface of the frame 220. In other words, the connection structures 230 may respectively extend through the through holes 220H of the frame 220 and may protrude from the top and bottom surfaces of the frame 220.

The expansion conductive structure 250 may include a plurality of expansion conductive patterns 252 on the top surface of the dielectric filling member 210 and a plurality of expansion vias 256, which pass through the dielectric filling member 210 and electrically connect some of the expansion conductive patterns 252 to the frame 220. In some embodiments, each of the plurality of expansion conductive patterns 252 may be integrally formed with a corresponding one of the plurality of expansion vias 256.

At least some of the expansion conductive patterns 252 electrically connected to the frame 220 through the expansion vias 256 may include ground planes. In some embodiments, an expansion conductive pattern 252 connected to the frame 220 through an expansion via 256 may be the reflector RFT of a patch antenna formed by the antenna part PAT. The reflector RFT may be grounded. A portion of the expansion conductive pattern 252 connected to the frame 220 through the expansion via 256 may overlap the semiconductor chip 100 in the vertical direction. In some embodiments, an expansion conductive pattern 252 forming a ground plane may overlap the entire top surface of the semiconductor chip 100 in the vertical direction. The reflector RFT may block a radio signal, which is transmitted or received by the antenna part PAT, from being transferred to the fan-out package part FOP.

The cover wiring structure 400 may include a second redistribution dielectric layer 410 and the second redistribution conductive structure 420. For example, the cover wiring structure 400 may correspond to a redistribution layer. Although the second redistribution dielectric layer 410 includes two layers, e.g., a second lower redistribution dielectric layer 412 and a second upper redistribution dielectric layer 414, which are stacked on each other, in FIG. 1A, this is just an example, and embodiments are not limited thereto. For example, the second redistribution dielectric layer 410 may include a plurality of layers stacked on one another.

The supporting wiring structure 300 may be referred to as a lower wiring structure, a first wiring structure, a lower redistribution layer, or a first redistribution layer. The cover wiring structure 400 may be referred to as an upper wiring structure, a second wiring structure, an upper redistribution layer, or a second redistribution layer.

The second redistribution dielectric layer 410 and the second redistribution conductive structure 420 may be respectively referred to as a second base dielectric layer and a second wiring pattern. For example, the second redistribution dielectric layer 410 may be formed from a build-up film. In some embodiments, the second redistribution dielectric layer 410 may include an ABF. For example, the second redistribution conductive structure 420 may include a metal or a metal alloy but is not limited thereto. In some embodiments, the second redistribution conductive structure 420 may include a stack of a metal or a metal alloy on a seed layer including titanium, titanium nitride, or titanium tungsten.

The second lower redistribution dielectric layer 412 may cover the expansion layer 200. For example, the second lower redistribution dielectric layer 412 may cover the top surface of the dielectric filling member 210 of the expansion layer 200 and may surround a plurality of expansion conductive patterns 252. In some embodiments, the second lower redistribution dielectric layer 412 may cover the top and side surfaces of the expansion conductive patterns 252. For example, the second lower redistribution dielectric layer 412 may contact the top and side surfaces of the expansion conductive patterns 252.

The second redistribution conductive structure 420 may include a plurality of second redistribution line patterns 422 between the second lower redistribution dielectric layer 412 and the second upper redistribution dielectric layer 414 and a plurality of second redistribution vias 426, which are connected to some of the second redistribution line patterns 422 and pass through the second lower redistribution dielectric layer 412. In some embodiments, at least some of the second redistribution line patterns 422 may be integrally formed with some of the second redistribution vias 426. For example, a second redistribution line pattern 422 may be integrally formed with a second redistribution via 426 contacting the bottom surface of the second redistribution line pattern 422.

In some embodiments, each of the second redistribution vias 426 may have a tapered shape having a horizontal width decreasing away from the top thereof toward the bottom thereof. In other words, the horizontal width of each of the second redistribution vias 426 may increase away from the semiconductor chip 100.

In some embodiments, a slope of a side surface of a second redistribution via 426 may be greater than a slope of a side surface of a first redistribution via 326. For example, an angle between the top and side surfaces of the second redistribution via 426 may be greater than an angle between the bottom and side surface of the first redistribution via 326.

Some of the second redistribution line patterns 422 may be electrically connected to the frame 220 through some of the second redistribution vias 426 and grounded, and others of second redistribution line patterns 422 may form the radiator RDT of a patch antenna, wherein the radiator RDT is electrically connected to the connection structures 230 through others of the second redistribution vias 426. Some of the second redistribution vias 426 may be connected to the frame 220 and grounded, and others of the second redistribution vias 426 may be connected to the connection structures 230 and may exchange signals with the radiator RDT of the antenna part PAT.

The radiator RDT of the patch antenna may overlap the director DR in the vertical direction. For example, the patch antenna may include a plurality of radiators RDT corresponding to a plurality of directors DR. The horizontal width and plane area of a radiator RDT of the patch antenna may be greater than or equal to the horizontal width and plane area of a director DR. For example, the entirety of the director DR of the patch antenna may overlap the radiator RDT of the patch antenna in the vertical direction.

The second upper redistribution dielectric layer 414 may cover the second redistribution conductive structure 420. For example, the second upper redistribution dielectric layer 414 may cover the top surface of the second lower redistribution dielectric layer 412 and surround the second redistribution line patterns 422. In some embodiments, the second upper redistribution dielectric layer 414 may cover the top and side surfaces of each of the second redistribution line patterns 422.

The antenna structure 500 may include a base board layer 510 and an antenna conductive structure 520. The antenna conductive structure 520 may include a plurality of antenna top conductive patterns 522 on the top surface of the base board layer 510 and a plurality of antenna bottom conductive patterns 524 on the bottom surface of the base board layer 510. The plurality of antenna top conductive patterns 522 may contact the top surface of the base board layer 510 and the plurality of antenna bottom conductive patterns 524 may contact the bottom surface of the base board layer 510. In some embodiments, the antenna conductive structure 520 may further include a ground via 526, which passes through the base board layer 510 and electrically connects one of the antenna top conductive patterns 522 to one of the antenna bottom conductive patterns 524. For example, the ground via 526 may contact one of the antenna top conductive patterns 522 and one of the antenna bottom conductive patterns 524.

The base board layer 510 may include at least one material selected from phenol resin, epoxy resin, and polyimide. For example, the base board layer 510 may include at least one material selected from FR-4, tetrafunctional epoxy, polyphenylene ether, epoxy/polyphenylene oxide, BT, thermount, cyanate ester, polyimide, and liquid crystal polymer. For example, the base board layer 510 may include polyester, polyester terephthalate (PET), fluorinated ethylene propylene (FEP), resin-coated paper, liquid polyimide resin, or a polyethylene naphthalate (PEN) film. The base board layer 510 may include a single layer but is not limited thereto. For example, the base board layer 510 may include a stack of a plurality of base layers.

For example, the antenna top conductive patterns 522 and the antenna bottom conductive patterns 524 may include electrolytically deposited (ED) copper, rolled-annealed (RA) copper foil, stainless steel foil, aluminum foil, ultra-thin copper foil, sputtered copper, a copper alloy, nickel, stainless steel, or beryllium copper.

For example, the ground via 526 may include sputtered copper, a copper alloy, nickel, stainless steel, or beryllium copper.

Some of the antenna top conductive patterns 522 and the antenna bottom conductive patterns 524 may form the director DR of the patch antenna, and others of the antenna top conductive patterns 522 and others of the antenna bottom conductive patterns 524 may form a guard ring GR.

The director DR of the patch antenna may include at least one first director DR1 corresponding to some of the antenna top conductive patterns 522 and at least one second director DR2 corresponding to some of the antenna bottom conductive patterns 524. The first director DR1 may be on the top surface of the base board layer 510, and the second director DR2 may be on the bottom surface of the base board layer 510. The first director DR1 may face the second director DR2 with the base board layer 510 between the first director DR1 and the second director DR2. The first director DR1 may vertically overlap the second director DR2.

The horizontal cross-section of the first director DR1 may be a circle, a near-circular ellipse, or an ellipse. A first horizontal width W1 of the first director DR1, e.g., the diameter when the first director DR1 is circular or the longer diameter when the first director DR1 is elliptical, may be about ½ to about ¼ times the wavelength of signals to be transmitted and received by the patch antenna. For example, the first horizontal width W1 may be about 0.2 mm to about 3 mm. The shape of the second director DR2 may be substantially the same as the shape of the first director DR1.

The guard ring GR may include at least one first guard ring GR1 corresponding to others of the antenna top conductive patterns 522 and at least one second guard ring GR2 corresponding to others of the antenna bottom conductive patterns 524. The first guard ring GR1 may be on the top surface of the base board layer 510, and the second guard ring GR2 may be on the bottom surface of the base board layer 510. The first guard ring GR1 may be separated from the first director DR1 on the top surface of the base board layer 510 and may surround the first director DR1. The second guard ring GR2 may be separated from the second director DR2 on the bottom surface of the base board layer 510 and may surround the second director DR2. The first guard ring GR1 may vertically overlap the second guard ring GR2.

The first guard ring GR1 may extend to surround the first director DR1. The first guard ring GR1 may have a second horizontal width W2. In some embodiments, the second horizontal width W2 may be about 0.3 mm to about 0.6 mm. In some embodiments, outer and inner edges of the first guard ring GR1 may have a square or rectangular shape. A third horizontal width W3 of the outer edge of the first guard ring GR1 may be about 0.5 times the wavelength of signals to be transmitted and received by the patch antenna. For example, when signals to be transmitted and received by the patch antenna have a wavelength of about 28 GHz, the third horizontal width W3 may be about 4 mm. The shape of the second guard ring GR2 may be substantially the same as the shape of the first guard ring GR1.

The patch antenna includes four directors DR, each of which includes the first director DR1 and the second director DR2 facing the first director DR1, in FIGS. 1A through 1C. However, embodiments are not limited thereto. For example, the patch antenna may include one director DR, or two, six, eight or more directors DR, each including the first director DR1 and the second director DR2 facing the first director DR1.

The ground via 526 may electrically connect at least one first guard ring GR1 to at least one second guard ring GR2. In some embodiments, at least one first guard ring GR1, at least one second guard ring GR2, and the ground via 526 may be grounded.

In some embodiments, the antenna structure 500 may further include an antenna protection layer 550, which covers the top surface of the base board layer 510 and surrounds the antenna top conductive patterns 522. In some embodiments, the antenna protection layer 550 may cover the top and side surfaces of the antenna top conductive patterns 522. For example, the antenna protection layer 550 may contact the top and side surfaces of the antenna top conductive patterns 522.

The antenna protection layer 550 may include a polyimide film, a polyester film, a flexible solder mask, a photo-imageable coverlay (PIC), or photo-imageable solder resist. For example, the antenna protection layer 550 may be formed by directly applying thermosetting ink to the base board layer 510 using silk-screen printing or inkjet printing and then performing thermosetting. For example, the antenna protection layer 550 may be formed by entirely applying photo-imageable solder resist to the base board layer 510 using a screen method or a spray coating method, then removing an unnecessary portion using exposure and development, and then performing thermosetting. For example, the antenna protection layer 550 may be formed using a laminating method by which a polyimide film or a polyester film is stuck to the base board layer 510.

According to example embodiments, the semiconductor package 1 is an integrated semiconductor package including the semiconductor chip 100 of the fan-out package part FOP together with the patch antenna formed by the antenna part PAT and may thus be compact and light.

According to example embodiments, the semiconductor package 1 includes the frame 220 that is grounded; a connection structure 230, which is in a through hole 220H of the frame 220 and includes a material having a higher electrical conductivity than the frame 220; and the dielectric filling member 210, which is in the through hole 220H and is between the connection structure 230 and the frame 220. The frame 220, the connection structure 230, a portion of the frame 220, which is adjacent to the through hole 220H and is grounded, and a portion of the dielectric filling member 210 between the frame 220 and the connection structure 230 may form a low-loss signal transmission line having a coaxial structure similar to a coaxial cable.

According to example embodiments, the semiconductor package 1 includes the reflector RFT, which is grounded and overlaps the semiconductor chip 100 in the vertical direction, thereby blocking a radio signal, which is transmitted or received by the antenna part PAT, from being transferred to the fan-out package part FOP. Because the semiconductor chip 100 and a plurality of connection structures 230 are arranged in the mounting space 2200 and a plurality of through holes 220H of the frame 220, heat generated from the semiconductor chip 100 and the connection structures 230 may be quickly emitted outside the semiconductor package 1.

Accordingly, the semiconductor package 1 may minimize a loss in a mmWave signal, which is transmitted or received by the antenna part PAT, while the mmWave signal is being transmitted to the semiconductor chip 100 through the connection structures 230 and may smoothly perform blocking between the antenna part PAT and the semiconductor chip 100 and emission of heat generated from the semiconductor chip 100 and the connection structures 230.

FIGS. 2A through 2H are cross-sectional views of stages in a method of manufacturing a semiconductor package, according to example embodiments.

Figure 2A:
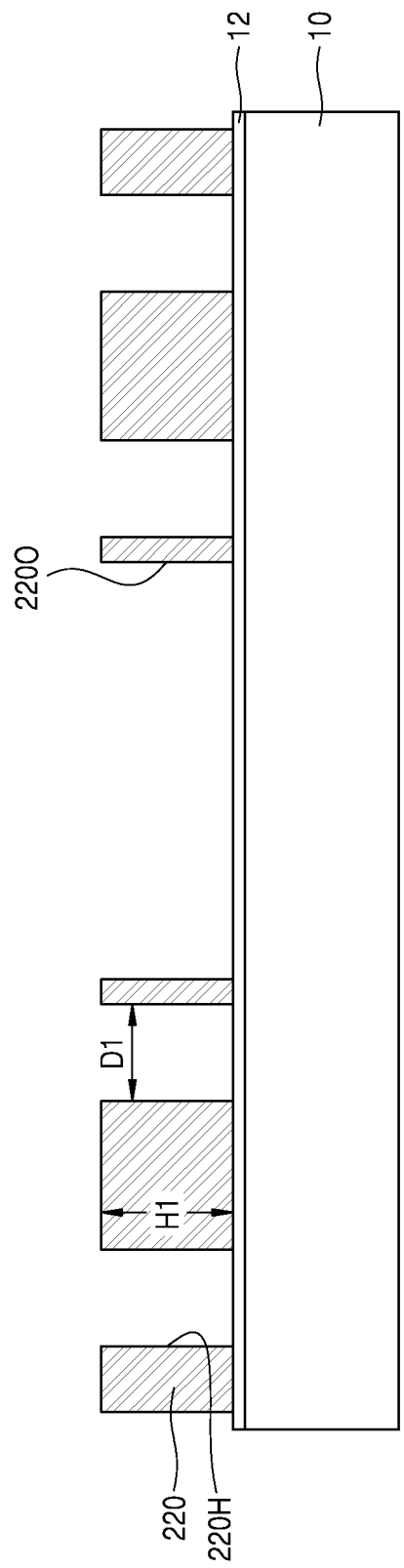

Referring to FIG. 2A, the frame 220 is attached to a first supporting member 10 with a first release film 12 between the frame 220 and the first supporting member 10. The frame 220 may have the first height H1. For example, the first height H1 may be about 60 µm to about 100 µm. The frame 220 may include at least one mounting space 2200 and a plurality of through holes 220H. For example, the mounting space 2200 and the through holes 220H may pass from the top surface of the frame 220 to the bottom surface of the frame 220. In some embodiments, the mounting space 2200 and the through holes 220H may respectively have inner side surfaces, which have substantially the same plane area and substantially extend in a vertical direction passing from the top surface to the bottom surface of the frame 220.

Figure 2B:
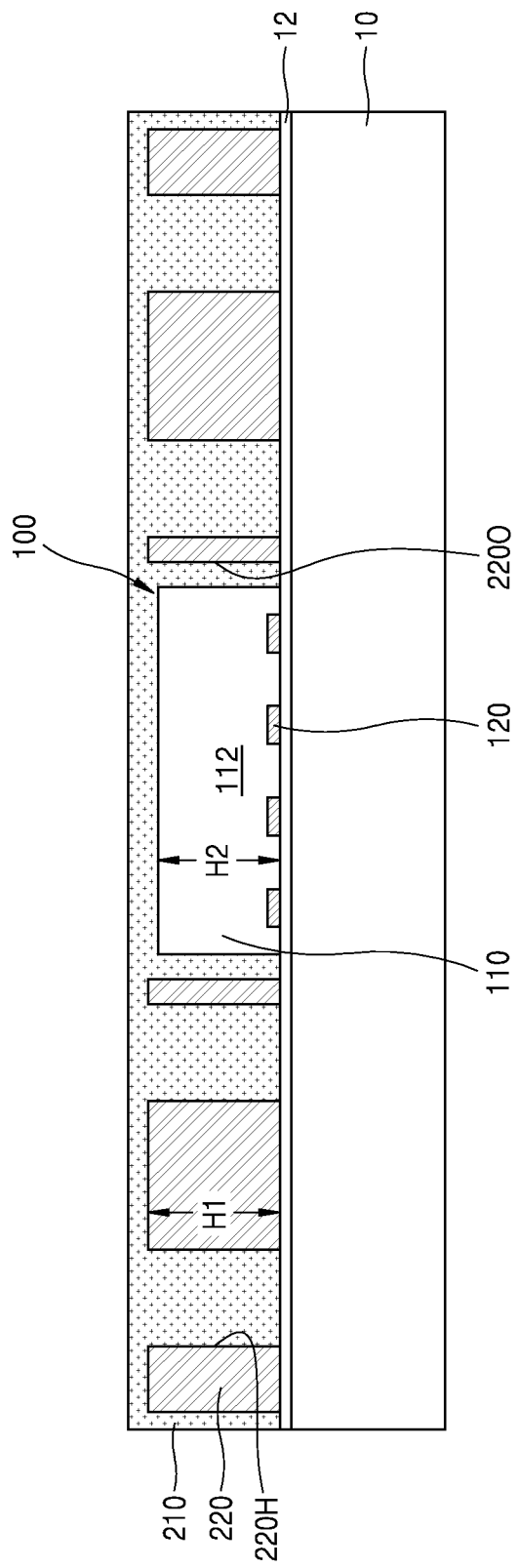

Referring to FIG. 2B, the semiconductor chip 100 is attached to the first supporting member 10 through the mounting space 2200 of the frame 220. The semiconductor chip 100 may include the semiconductor substrate 110, which has the semiconductor device 112 on the active side thereof, and the chip connection pads 120 on the active side of the semiconductor substrate 110.

The bottom surface of the frame 220 may be at the same vertical level as the bottom surface of the semiconductor chip 100. The top surface of the semiconductor chip 100 may be at a lower vertical level than the top surface of the frame 220. The semiconductor chip 100 may have the second height H2. The first height H1 may be greater than the second height H2. For example, the second height H2 may be about 50 µm to about 80 µm.

Thereafter, the dielectric filling member 210 may be formed to fill the through holes 220H and the mounting space 2200 and to cover the top surface of the frame 220. The dielectric filling member 210 may fill the space between the semiconductor chip 100 and the inner side surface of the mounting space 2200 to surround the semiconductor chip 100. The dielectric filling member 210 may entirely cover the side and top surfaces of the semiconductor chip 100.

Figure 2C:
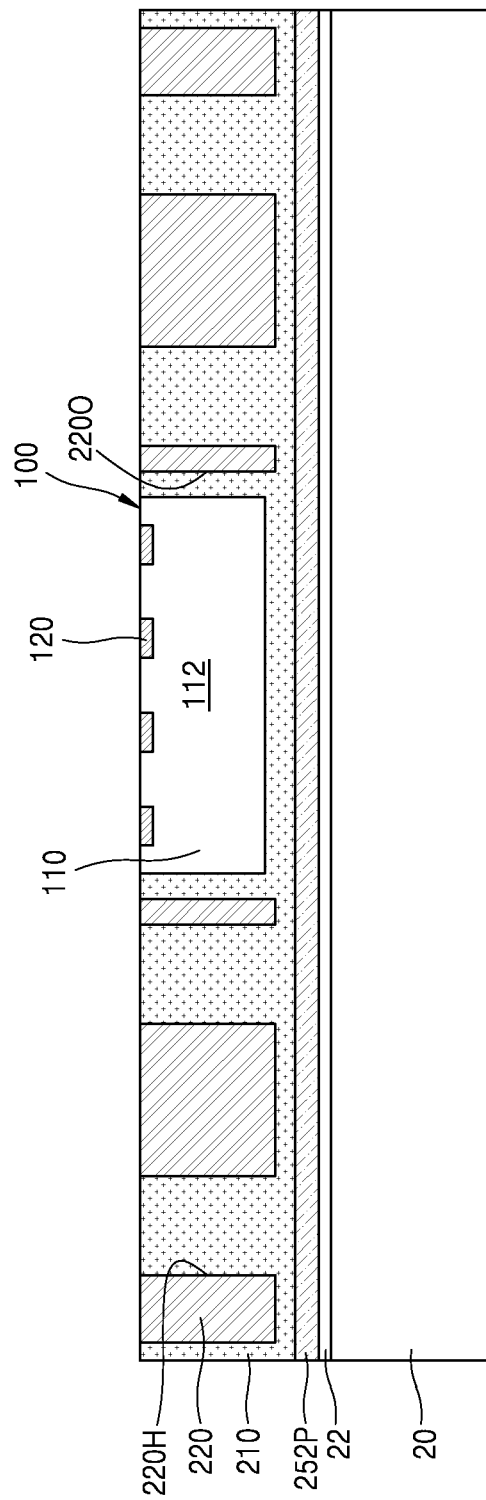

Referring to FIGS. 2B and 2C, a second supporting member 20, to which an expansion conductive layer 252P is attached with a second release film 22 between the expansion conductive layer 252P and the second supporting member 20, is prepared. For example, the expansion conductive layer 252P may include ED copper, RA copper foil, stainless steel foil, aluminum foil, ultra-thin copper foil, or sputtered copper.

The first release film 12 and the first support member 10 are removed from the resultant structure of FIG. 2B such that the semiconductor chip 100, the dielectric filling member 210, and the frame 220 remain.

Thereafter, a structure including the semiconductor chip 100, the dielectric filling member 210, and the frame 220 is turned over and attached to the expansion conductive layer 252P. The top surface of the dielectric filling member 210 in FIG. 2B becomes the bottom surface thereof and in contact with the expansion conductive layer 252P.

Referring to FIG. 2D, the supporting wiring structure 300 is formed on the semiconductor chip 100, the dielectric filling member 210, and the frame 220. The supporting wiring structure 300 may include the first redistribution dielectric layer 310 and the first redistribution conductive structure 320. For example, the supporting wiring structure 300 may correspond to a redistribution layer. In some embodiments, the first redistribution dielectric layer 310 may be formed from a PID or PSPI. In some embodiments, the first redistribution conductive structure 320 may include a stack of a metal or a metal alloy on a seed layer. For example, the seed layer may be formed by physical vapor deposition (PVD), and the metal or the metal alloy stacked on the seed layer may be formed by electroless plating.

After the first redistribution dielectric layer 310 is formed on the semiconductor chip 100, the dielectric filling member 210, and a process of forming a plurality of first redistribution vias 326, which pass through the first redistribution dielectric layer 310, and a plurality of first redistribution line patterns 322, which are connected to the first redistribution vias 326 and arranged on the first redistribution dielectric layer 310, may be repeated at least once to form the supporting wiring structure 300. In some embodiments, at least some of the first redistribution line patterns 322 may be respectively integrally formed with some of the first redistribution vias 326.

In some embodiments, each of the first redistribution vias 326 may have a tapered shape of which the horizontal width increases away from the semiconductor chip 100.

Some of the first redistribution line patterns 322 at the top, i.e., at a vertical level farthest from the semiconductor chip 100 in the vertical direction, may function as the external connection terminal TM. The external connection terminal TM may include the signal terminal TMS and the ground terminal TMG. A data signal, a control signal, or power may be provided to the signal terminal TMS. The ground terminal TMG may be grounded.

Figure 2E:
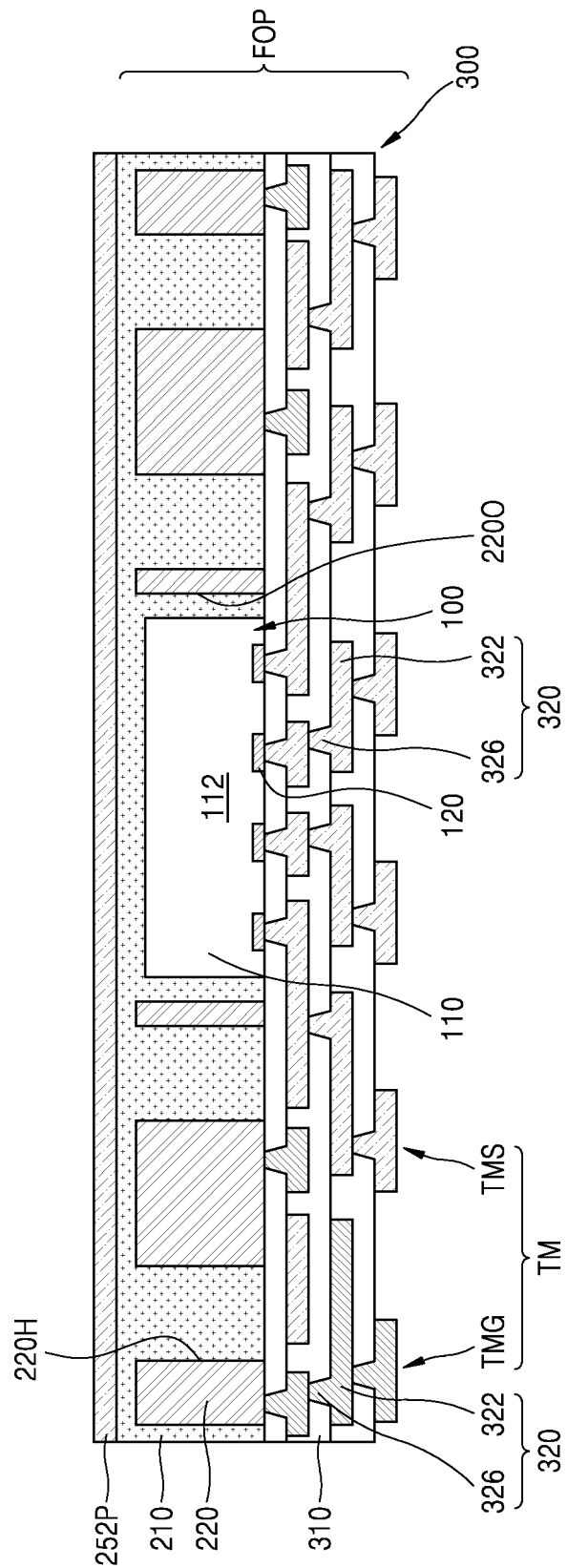

Referring to FIGS. 2D and 2E, the second release film 22 and the second supporting member 20 are removed from the resultant structure of FIG. 2D, and then the resultant structure is turned over. The expansion conductive layer 252P may be separated from the second release film 22 and thus remain on the semiconductor chip 100, the dielectric filling member 210, and the frame 220. The supporting wiring structure 300 may be located below the semiconductor chip 100, the dielectric filling member 210, and the frame 220.

Figure 2F:
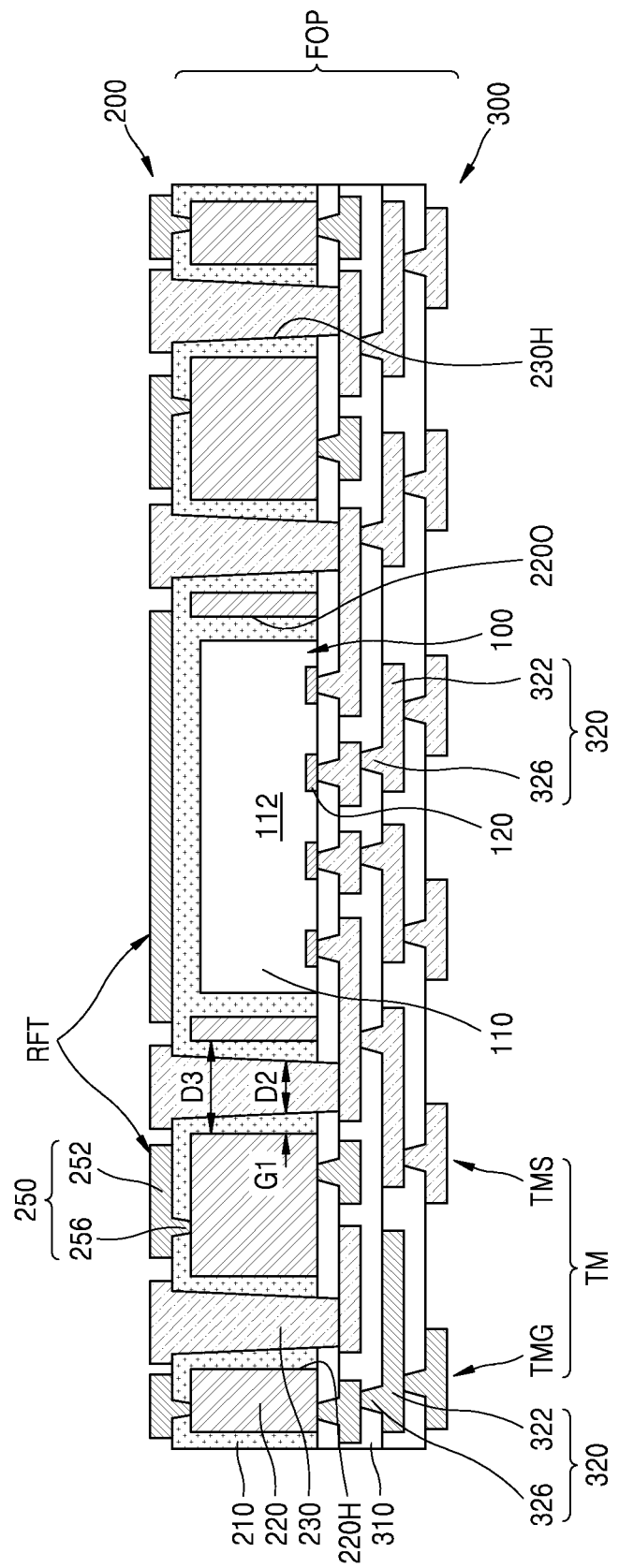

Referring to FIG. 2F, the dielectric filling member 210 is partially removed to form a plurality of connection holes 230H, which respectively extend in the through holes 220H and pass through the dielectric filling member 210. For example, the connection holes 230H may be formed by partially removing the dielectric filling member 210 using laser drilling. The first redistribution conductive structure 320 may be exposed at the bottom of each of the connection holes 230H. The connection holes 230H pass through the dielectric filling member 210 and the first redistribution dielectric layer 310 and partially expose the first redistribution line patterns 322 at the bottoms thereof in FIG. 2F, but embodiments are not limited thereto. For example, the connection holes 230H may pass through the dielectric filling member 210 and partially expose the first redistribution vias 326 at the bottoms thereof.

Thereafter, a conductive material filling the connection holes 230H may be formed to form a plurality of connection structures 230. The conductive material may have a higher electrical conductivity than the frame 220. For example, the conductive material may include Cu or a Cu alloy but is not limited thereto.

Before the connection structures 230 are formed, the dielectric filling member 210, which covers the top surface of the frame 220, and the expansion conductive layer 252P (FIG. 2E) may be partially removed to form via holes exposing portions of the top surface of the frame 220. For example, the via holes may be formed by partially removing the dielectric filling member 210 and the expansion conductive layer 252P using laser drilling. Thereafter, the conductive material may be formed to fill the connection holes 230H and the via holes at the same time.

In some embodiments, the expansion conductive patterns 252 and the connection structures 230 may be formed by patterning the expansion conductive layer 252P and the conductive material. In some embodiments, before the conductive material is formed, a mask layer having openings respectively corresponding to the expansion conductive patterns 252 and the connection structures 230 may be formed. Thereafter, the conductive material may be formed to fill the openings, and a lift process may be performed to remove the mask layer so that the expansion conductive patterns 252 and the connection structures 230 may be formed.

Portions of the conductive material respectively filling the via holes may become expansion vias 256. The expansion vias 256 may respectively electrically connect some of the expansion conductive patterns 252 to the frame 220. The expansion conductive patterns 252 and the expansion vias 256 may be collectively referred to as the expansion conductive structure 250. The dielectric filling member 210, the frame 220, the connection structures 230, and the expansion conductive structure 250 may be collectively referred to as the expansion layer 200.

At least some of the expansion conductive patterns 252 electrically connected to the frame 220 through the expansion vias 256 may include ground planes. In some embodiments, an expansion conductive pattern 252 connected to the frame 220 through an expansion via 256 may be the reflector RFT of the patch antenna. The reflector RFT may be grounded. The reflector RFT may overlap the semiconductor chip 100 in the vertical direction. In some embodiments, the reflector RFT may overlap the entire top surface of the semiconductor chip 100 in the vertical direction.

Figure 2G:
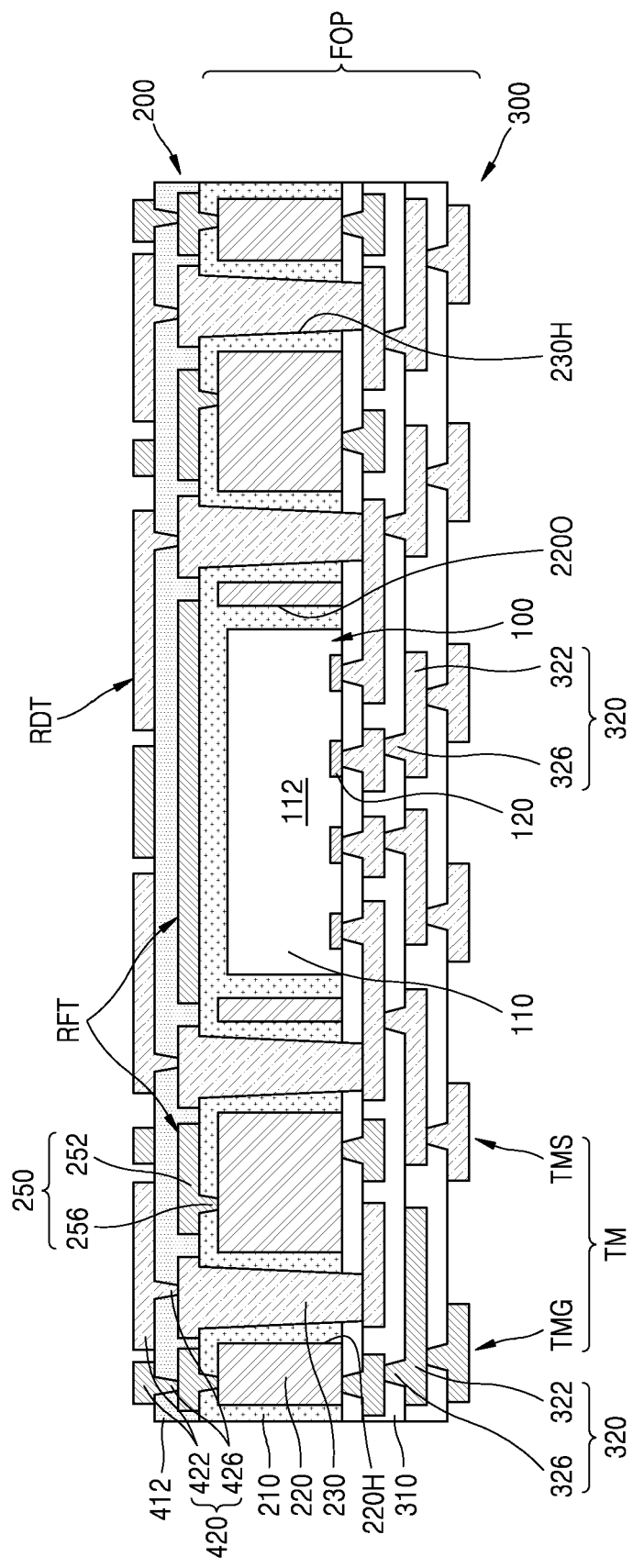

Referring to FIG. 2G, after the second lower redistribution dielectric layer 412 covering the expansion layer 200 is formed and partially removed to form via holes, which partially expose the top surfaces of the connection structures 230 and the expansion conductive structure 250, a conductive material is formed to fill the via holes and cover the second lower redistribution dielectric layer 412. For example, the via holes may be formed by partially removing the second lower redistribution dielectric layer 412 using laser drilling. In some embodiments, the conductive material may be patterned to form the second redistribution conductive structure 420, which includes a plurality of second redistribution line patterns 422 on the second lower redistribution dielectric layer 412 and a plurality of second redistribution vias 426. The second redistribution vias 426 are connected to some of the second redistribution line patterns 422 and pass through the second lower redistribution dielectric layer 412. In some embodiments, before the conductive material is formed, a mask layer having openings respectively corresponding to the second redistribution line patterns 422 may be formed. The conductive material may be formed to fill the openings, and a lift process may be performed to remove the mask layer so that the second redistribution line patterns 422 may be formed.

Some of the second redistribution line patterns 422 may be electrically connected to the frame 220 through some of the second redistribution vias 426 and grounded, and others of the second redistribution line patterns 422 may form the radiator RDT of a patch antenna, wherein the radiator RDT is electrically connected to the connection structures 230 through others of the second redistribution vias 426.

Figure 2H:
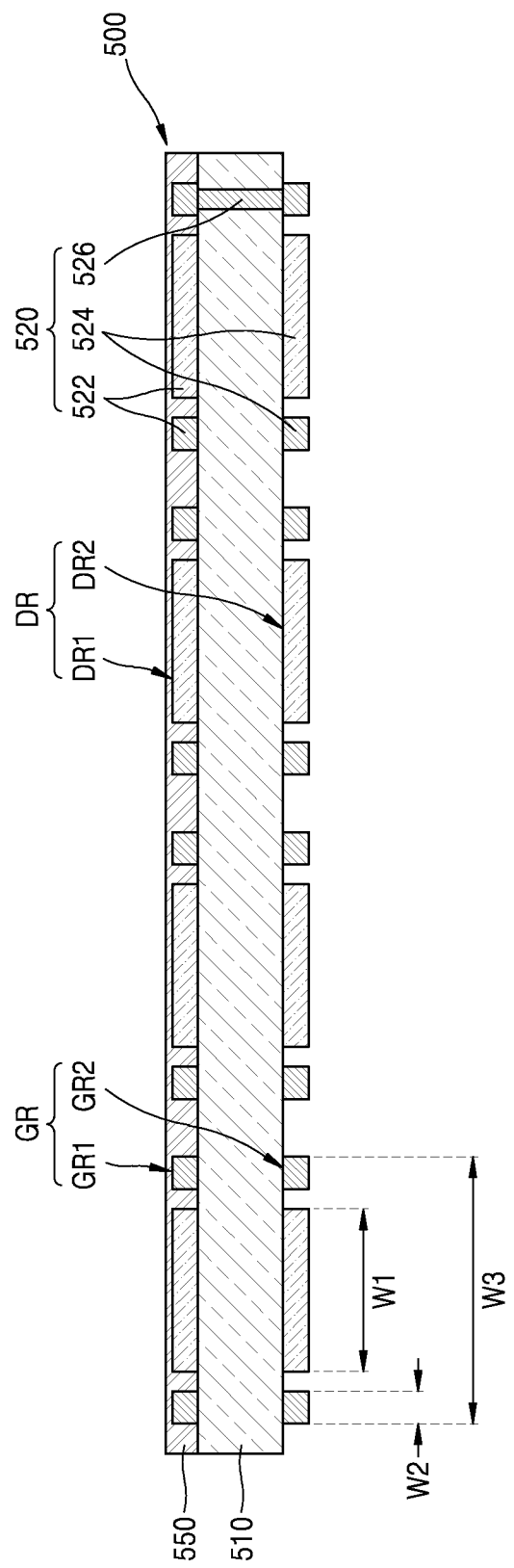

Referring to FIG. 2H, the antenna structure 500 including the base board layer 510 and the antenna conductive structure 520 may be formed. In some embodiments, the antenna structure 500 may include a printed circuit board. The antenna conductive structure 520 may include a plurality of antenna top conductive patterns 522 on the top surface of the base board layer 510 and a plurality of antenna bottom conductive patterns 524 on the bottom surface of the base board layer 510. In some embodiments, the antenna conductive structure 520 may further include the ground via 526, which passes through the base board layer 510 and electrically connects one of the antenna top conductive patterns 522 to one of the antenna bottom conductive patterns 524.

Some of the antenna top conductive patterns 522 and the antenna bottom conductive patterns 524 may form the director DR of the patch antenna, and others of the antenna top conductive patterns 522 and the antenna bottom conductive patterns 524 may form the guard ring GR.

The director DR of the patch antenna may include at least one first director DR1 corresponding to some of the antenna top conductive patterns 522 and at least one second director DR2 corresponding to some of the antenna bottom conductive patterns 524. The first director DR1 may be on the top surface of the base board layer 510, and the second director DR2 may be on the bottom surface of the base board layer 510. The first director DR1 may face the second director DR2 with the base board layer 510 between the first director DR1 and the second director DR2.

The first horizontal width W1 of the director DR may be about 0.3 times the wavelength of signals to be transmitted and received by the patch antenna. The guard ring GR may extend with the second horizontal width W2 to surround the director DR. In some embodiments, the second horizontal width W2 may be about 0.3 mm to about 0.6 mm. The third horizontal width W3 of the outer edge of the guard ring GR may be about 0.5 times the wavelength of signals to be transmitted and received by the patch antenna.

The guard ring GR may include at least one first guard ring GR1 corresponding to some of the antenna top conductive patterns 522 and at least one second guard ring GR2 corresponding to some of the antenna bottom conductive patterns 524. The first guard ring GR1 may be on the top surface of the base board layer 510, and the second guard ring GR2 may be on the bottom surface of the base board layer 510. The first guard ring GR1 may be separated from the first director DR1 on the top surface of the base board layer 510 and may surround the first director DR1. The second guard ring GR2 may be separated from the second director DR2 on the bottom surface of the base board layer 510 and may surround the second director DR2.

The ground via 526 may electrically connect the first guard ring GR1 to the second guard ring GR2. In some embodiments, the first guard ring GR1, the second guard ring GR2, and the ground via 526 may be grounded.

In some embodiments, the antenna protection layer 550 may be further formed to cover the top surface of the base board layer 510 and surround the antenna top conductive patterns 522. In some embodiments, the antenna protection layer 550 may cover the top and side surfaces of the antenna top conductive patterns 522.

Thereafter, as shown in FIG. 1A, the antenna structure 500 may be attached to the second lower redistribution dielectric layer 412 and the second redistribution line patterns 422 with the second upper redistribution dielectric layer 414 between the antenna structure 500 and each of the second lower redistribution dielectric layer 412 and the second redistribution line patterns 422.

Figure 3:
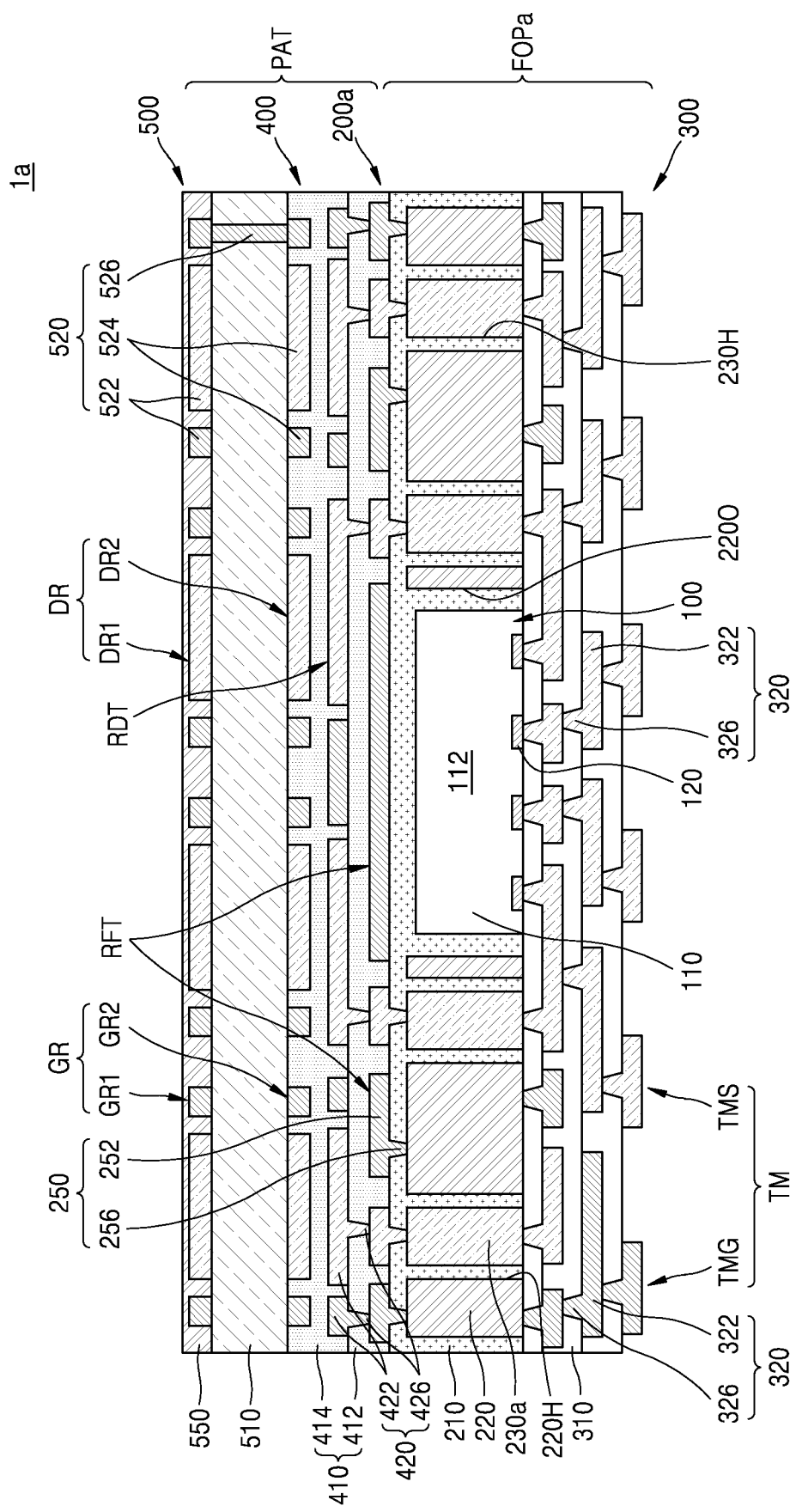
FIG. 3 is a cross-sectional view of a semiconductor package, according to example embodiments.

FIG. 3 is a cross-sectional view of a semiconductor package according to example embodiments. In FIGS. 1A through 1C and FIG. 3, like numerals denote like elements, and redundant description may be omitted.

Referring to FIG. 3, a semiconductor package 1a may include a fan-out package part FOPa and the antenna part PAT. The fan-out package part FOPa may include the semiconductor chip 100. The semiconductor package 1a may include the supporting wiring structure 300, an expansion layer 200a on the supporting wiring structure 300, the semiconductor chip 100 in the expansion layer 200a, the cover wiring structure 400 on the semiconductor chip 100 and the expansion layer 200a, and the antenna structure 500 on the cover wiring structure 400.

The expansion layer 200a may include the dielectric filling member 210, the frame 220, a plurality of connection structures 230a, and the expansion conductive structure 250. In other words, the expansion layer 200a in FIG. 3 may include the connection structures 230a instead of the connection structures 230 included in the expansion layer 200 in FIG. 1A.

Each of the connection structures 230a may include a conductive pillar. The connection structures 230a may include a material having a higher electrical conductivity than the frame 220. For example, the connection structures 230a may include Cu or a Cu alloy but is not limited thereto. Each of the connection structures 230a may extend with substantially a constant horizontal width from a top thereof to a bottom thereof.

Figure 4A:
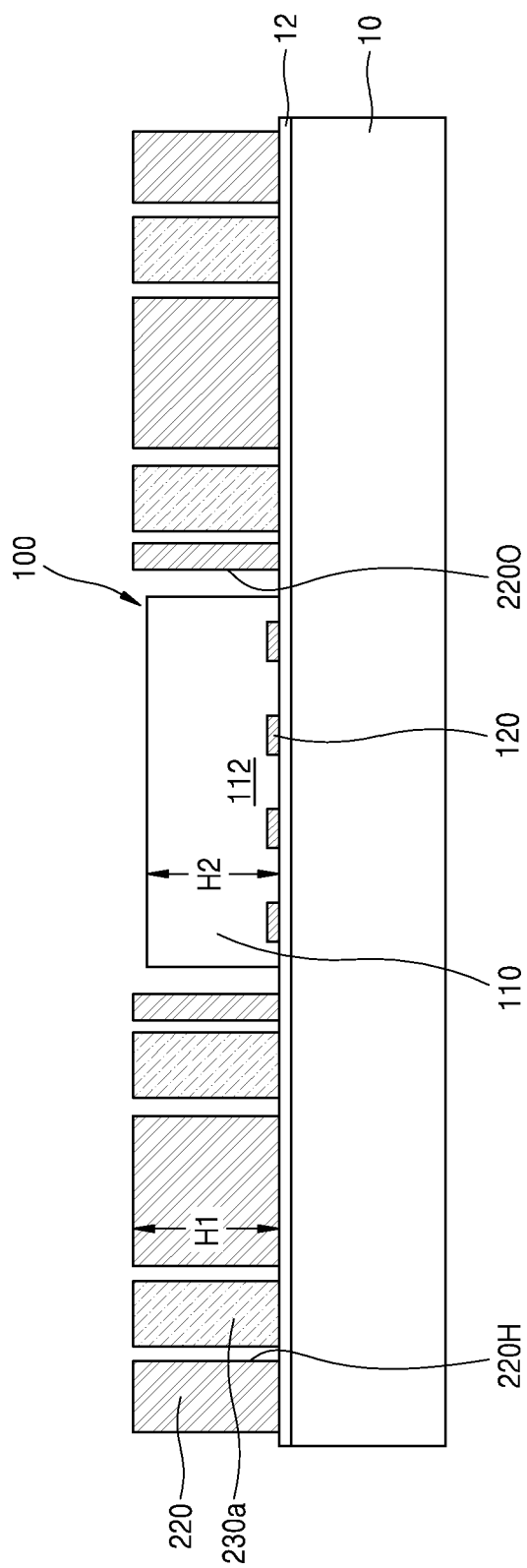
FIGS. 4A and 4B are cross-sectional views of stages in a method of manufacturing a semiconductor package, according to example embodiments.
Figure 4B:
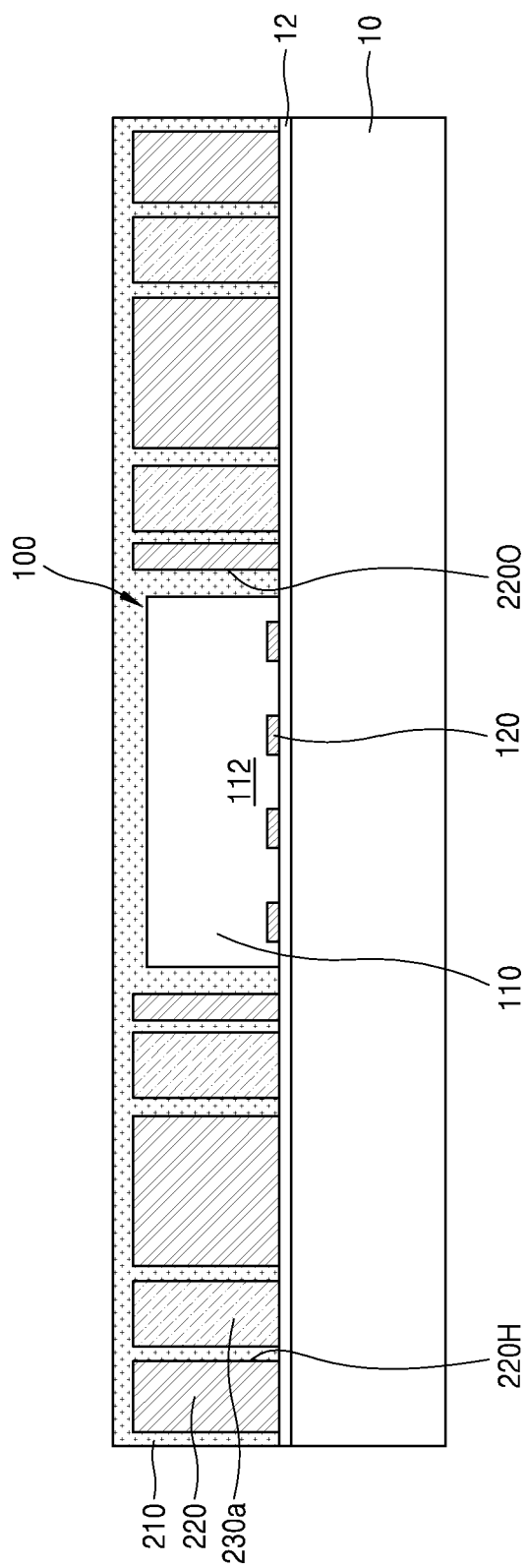

FIGS. 4A and 4B are cross-sectional views of stages in a method of manufacturing a semiconductor package, according to example embodiments. In detail, FIGS. 4A and 4B are cross-sectional views of stages substituting for the stage of FIG. 2B in the method of manufacturing a semiconductor package, which has been described with reference to FIGS. 2A through 2H.

Referring to FIG. 4A, the semiconductor chip 100 is attached to the first support member 10 through the mounting space 2200, and the connection structures 230a are attached to the first support member 10 through the through holes 220H.

The bottom surface of the frame 220 may be at the same vertical level as the bottom surface of the semiconductor chip 100. The top surface of the semiconductor chip 100 may be at a lower vertical level than the top surface of the frame 220. The semiconductor chip 100 may have the second height H2. The first height H1 may be greater than the second height H2. For example, the second height H2 may be about 50 μm to about 80 μm.

The bottom surface of the frame 220 may be at the same vertical level as the bottom surfaces of the connection structures 230a. The top surfaces of the connection structures 230a may be at the same vertical level as the top surface of the frame 220 in FIG. 4A, but embodiments are not limited thereto. In some embodiments, the top surfaces of the connection structures 230a may be at a lower vertical level than the top surface of the frame 220. In some embodiments, the top surfaces of the connection structures 230a may be at a higher vertical level than the top surface of the frame 220.

Referring to FIG. 4B, the dielectric filling member 210 may be formed to fill the through holes 220H and the mounting space 2200 and to cover the top surface of the frame 220. The dielectric filling member 210 may fill the space between the semiconductor chip 100 and the inner side surface of the mounting space 2200 to surround the semiconductor chip 100 and the connection structures 230a.

In some embodiments, the dielectric filling member 210 may entirely cover the side and top surfaces of the semiconductor chip 100 and the side and top surfaces of the connection structures 230a. In some embodiments, the dielectric filling member 210 may entirely cover the side and top surfaces of the semiconductor chip 100 and the side surfaces of the connection structures 230a but not the top surfaces of the connection structures 230a Thereafter, the semiconductor package 1a of FIG. 3 may be formed referring to the method described with reference to FIGS. 2C through 2H. However, instead of forming the through holes 220H and the connection structures 230 in the through holes 220H as shown in FIG. 2F, some of a plurality of expansion conductive patterns 252 may be respectively electrically connected to the connection structures 230a through some of a plurality of expansion vias 256.

Figure 5:
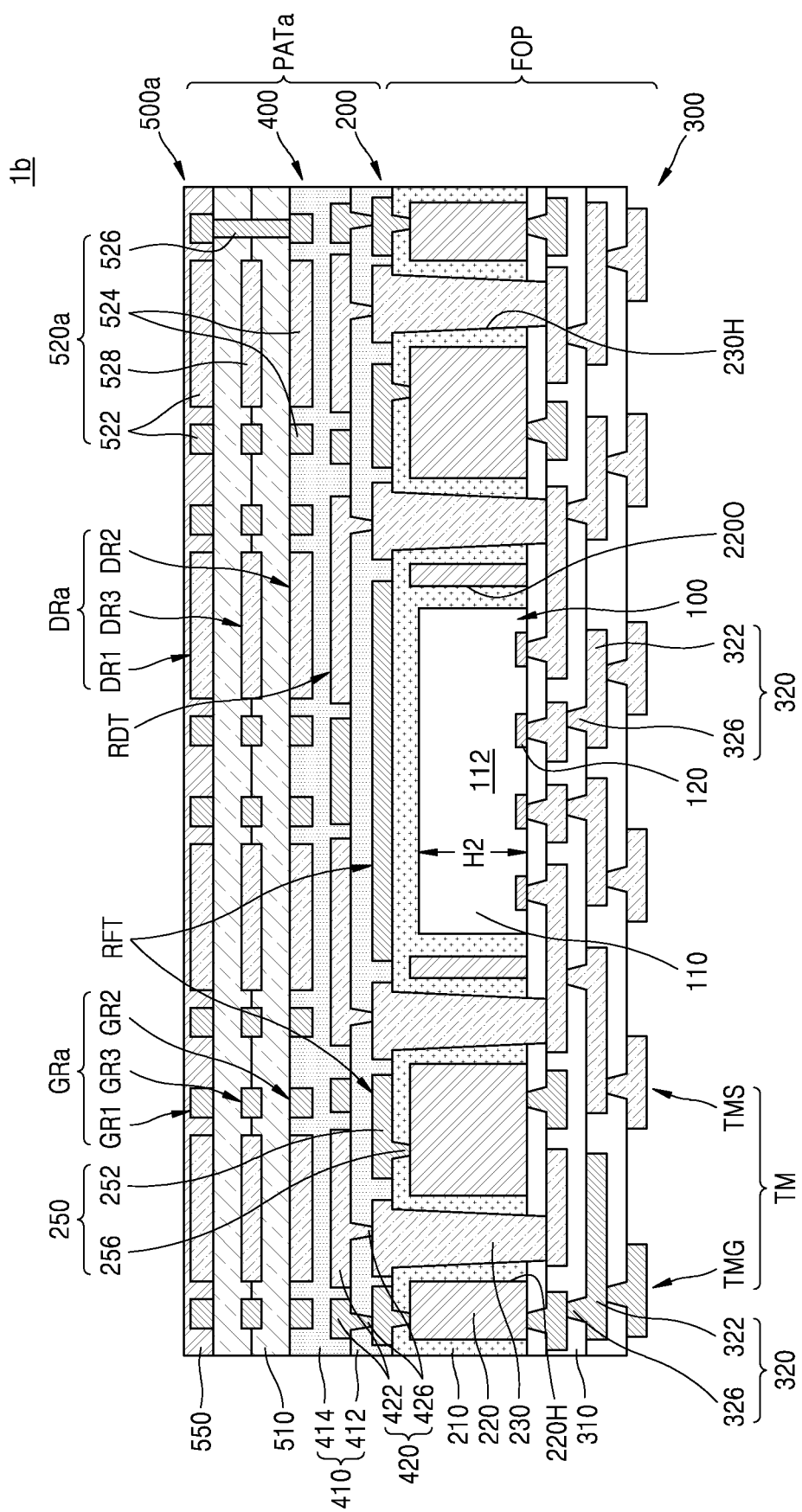
FIG. 5 is a cross-sectional view of a semiconductor package, according to example embodiments.

FIG. 5 is a cross-sectional view of a semiconductor package according to example embodiments. In FIGS. 1A through 1C and FIG. 5, like numerals denote like elements, and redundant description may be omitted.

Referring to FIG. 5, a semiconductor package 1b may include the fan-out package part FOP and an antenna part PATa. The semiconductor package 1b may include the supporting wiring structure 300, the expansion layer 200 on the supporting wiring structure 300, the semiconductor chip 100 in the expansion layer 200, the cover wiring structure 400 on the semiconductor chip 100 and the expansion layer 200, and an antenna structure 500a on the cover wiring structure 400.

The antenna structure 500a may include a stack of at least two base board layers 510 and an antenna conductive structure 520a. The antenna conductive structure 520a may include a plurality of antenna top conductive patterns 522 on the top surface of the stack of the base board layers 510, a plurality of antenna bottom conductive patterns 524 on the bottom surface of the stack of the base board layers 510, and a plurality of antenna inner conductive patterns 528 between the base board layers 510. In some embodiments, the antenna conductive structure 520a may further include the ground via 526, which passes through the stack of the base board layers 510 and electrically connects one of the antenna top conductive patterns 522 to one of the antenna bottom conductive patterns 524.

Some of the antenna top conductive patterns 522, the antenna bottom conductive patterns 524, and the antenna inner conductive patterns 528 may form a director DRa of the patch antenna; and others of the antenna top conductive patterns 522, the antenna bottom conductive patterns 524, and the antenna inner conductive patterns 528 may form a guard ring GRa.

The director DRa of the patch antenna may include the first director DR1, the second director DR2, and a third director DR3 corresponding to some of the antenna inner conductive patterns 528. The first director DR1, the second director DR2, and the third director DR3 may vertically overlap one another. The guard ring GRa may include the first guard ring GR1, the second guard ring GR2, and a third guard ring GR3 corresponding to others of the antenna inner conductive patterns 528. The first guard ring GR1, the second guard ring GR2, and the third guard ring GR3 may vertically overlap one another.

In other words, unlike the semiconductor package 1 of FIGS. 1A through 1C, the semiconductor package 1b of FIG. 5 may further include the third director DR3 between the first director DR1 and the second director DR2 and the third guard ring GR3 surrounding the third director DR3.

Figure 6A:
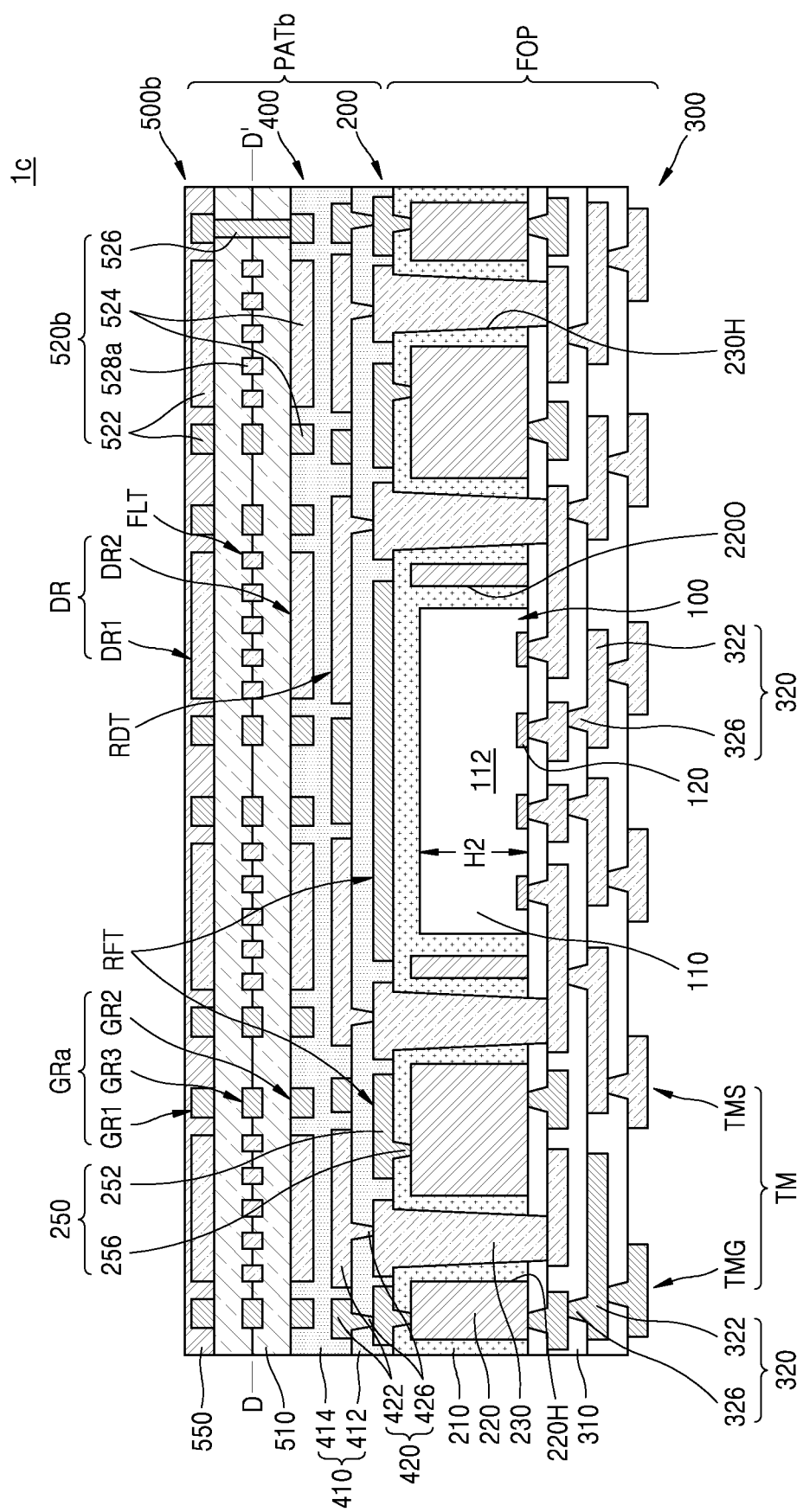
Figure 6B:
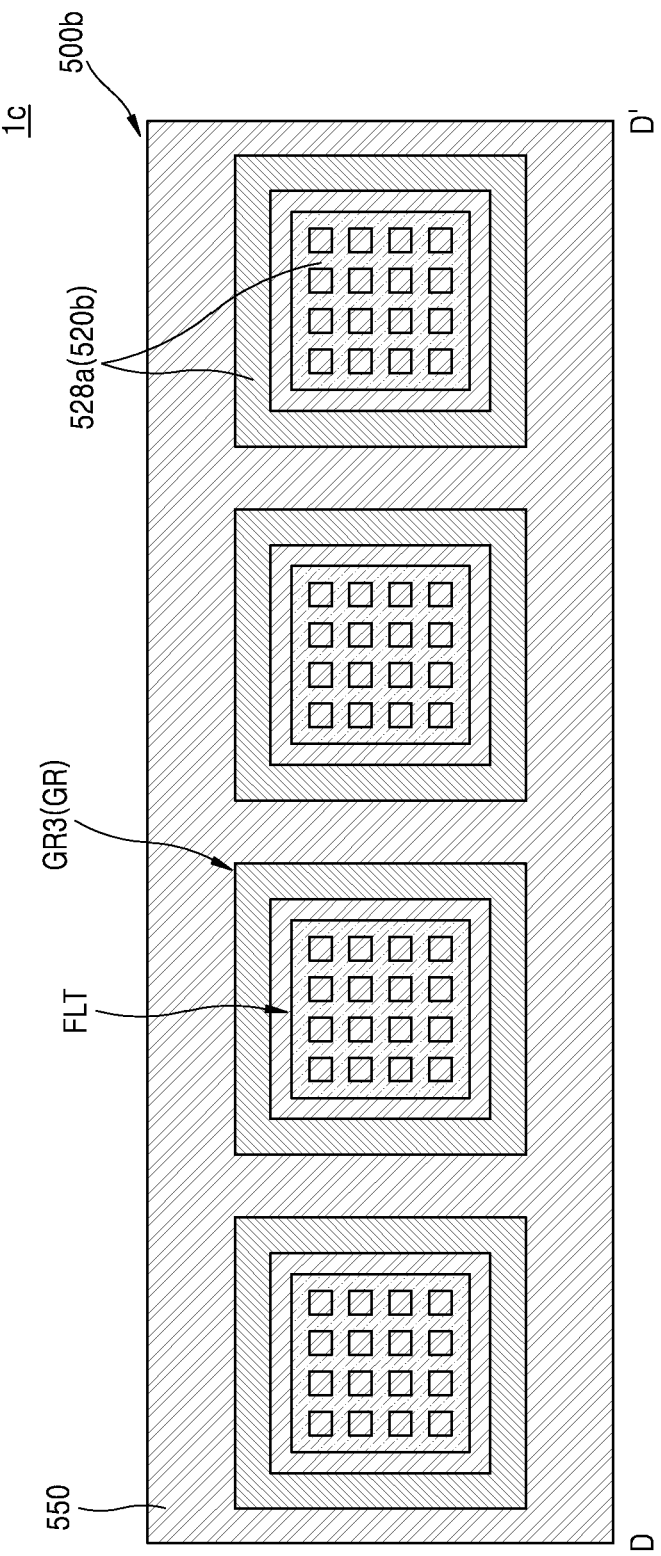

FIGS. 6A and 6B are cross-sectional views of a semiconductor package according to example embodiments, wherein FIG. 6B is a cross-sectional view taken along line D-D' in FIG. 6A. In FIGS. 5 through 6B, like numerals denote like elements, and redundant description may be omitted.

Referring to FIGS. 6A and 6B, a semiconductor package 1c may include the fan-out package part FOP and an antenna part PATb. The semiconductor package 1c may include the supporting wiring structure 300, the expansion layer 200 on the supporting wiring structure 300, the semiconductor chip 100 in the expansion layer 200, the cover wiring structure 400 on the semiconductor chip 100 and the expansion layer 200, and an antenna structure 500b on the cover wiring structure 400.

The antenna structure 500b may include a stack of at least two base board layers 510 and the antenna conductive structure 520a. The antenna conductive structure 520a may include a plurality of antenna top conductive patterns 522 on the top surface of the stack of the base board layers 510, a plurality of antenna bottom conductive patterns 524 on the bottom surface of the stack of the base board layers 510, and a plurality of antenna inner conductive patterns 528a between the base board layers 510. In some embodiments, the antenna conductive structure 520a may further include the ground via 526, which passes through the stack of the base board layers 510 and electrically connects one of the antenna top conductive patterns 522 to one of the antenna bottom conductive patterns 524.

Some of the antenna top conductive patterns 522 and the antenna bottom conductive patterns 524 may form the director DR of the patch antenna, and some of the antenna inner conductive patterns 528a may form a filter FLT. Others of the antenna top conductive patterns 522, the antenna bottom conductive patterns 524, and the antenna inner conductive patterns 528a may form the guard ring GRa.

In other words, instead of the third director DR3 of the semiconductor package 1b of FIG. 5, the semiconductor package 1c of FIGS. 6A and 6B may further include the filter FLT between the first director DR1 and the second director DR2. The filter FLT may vertically overlap the first director DR1 and the second director DR2. In some embodiments, the filter FLT may have a grid shape in a horizontal plane view. The filter FLT may filter out a certain frequency band from a radio signal transmitted between the first director DR1 and the second director DR2.

Figure 7:
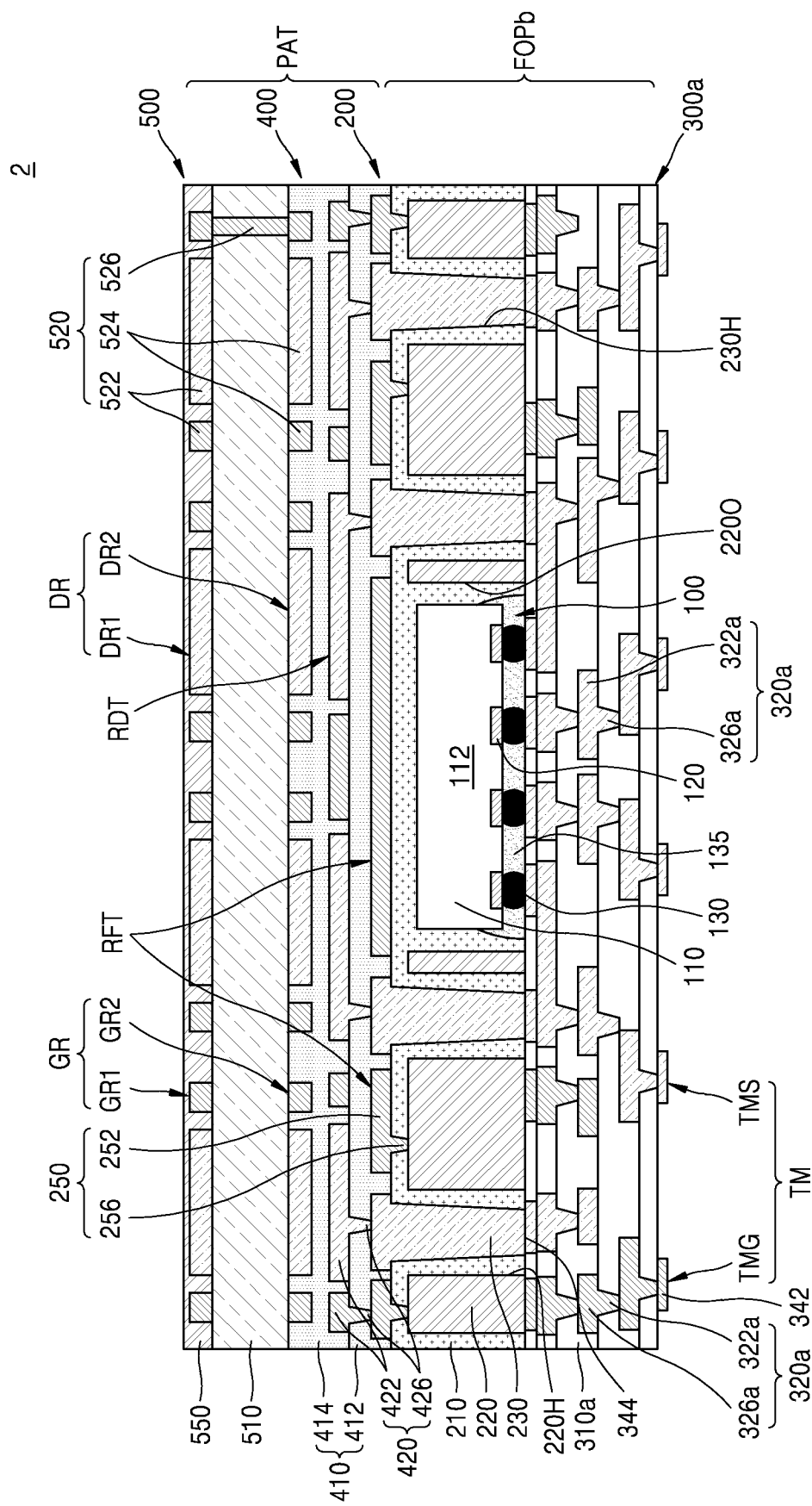
FIG. 7 is a cross-sectional view of a semiconductor package, according to example embodiments.

FIG. 7 is a cross-sectional view of a semiconductor package according to example embodiments. In FIGS. 1A through 1C and FIG. 7, like numerals denote like elements, and redundant description may be omitted.

Referring to FIG. 7, a semiconductor package 2 may include a fan-out package part FOPb and the antenna part PAT. The fan-out package part FOPb may include the semiconductor chip 100. The semiconductor package 2 may include a supporting wiring structure 300a, the expansion layer 200 on the supporting wiring structure 300a, the semiconductor chip 100 in the expansion layer 200, the cover wiring structure 400 on the semiconductor chip 100 and the expansion layer 200, and the antenna structure 500 on the cover wiring structure 400.

The supporting wiring structure 300a may include a first redistribution dielectric layer 310a and a first redistribution conductive structure 320a. For example, the supporting wiring structure 300a may correspond to a redistribution layer. In some embodiments, the supporting wiring structure 300a may include a plurality of first redistribution dielectric layers 310a, which are stacked on each other.

The first redistribution conductive structure 320a may include a plurality of first redistribution line patterns 322a on at least one of a top surface and a bottom surface of the first redistribution dielectric layer 310a and a plurality of first redistribution vias 326a passing through the first redistribution dielectric layer 310a and respectively contacting some of the first redistribution line patterns 322a. In some embodiments, at least some of the first redistribution line patterns 322a may be integrally formed with some of the first redistribution vias 326a. For example, a first redistribution line pattern 322a may be integrally formed with a first redistribution via 326a contacting the bottom surface of the first redistribution line pattern 322a.

In some embodiments, each of the first redistribution vias 326a may have a tapered shape having a horizontal width decreasing away from the top thereof toward the bottom thereof. In other words, the horizontal width of each of the first redistribution vias 326a may decrease away from the semiconductor chip 100.

A plurality of redistribution bottom pads 342 may be on bottom most portions of the first redistribution conductive structure 320a, and a plurality of redistribution top pads 344 may be on the top most portions of the first redistribution conductive structure 320a. The redistribution bottom pads 342 may function as the external connection terminal TM. The external connection terminal TM may include the signal terminal TMS and the ground terminal TMG.

Some of the redistribution top pads 344 may be electrically connected to the semiconductor chip 100, and some of the redistribution top pads 344 may be electrically connected to the frame 220, and others of the redistribution top pads 344 may be electrically connected to the connection structures 230.

The semiconductor chip 100 may be mounted on the supporting wiring structure 300a in a flip-chip manner. The chip connection pads 120 of the semiconductor chip 100 may be electrically connected to the semiconductor device 112 and to the supporting wiring structure 300a. A plurality of chip connection terminals 130 may be arranged between some of the redistribution top pads 344 and the chip connection pads 120 and may electrically connect the semiconductor chip 100 to the first redistribution line pattern 322a of the supporting wiring structure 300a. For example, the chip connection terminals 130 may include solder balls or bumps.

In some embodiments, an underfill layer 135 may be between the semiconductor chip 100 and the supporting wiring structure 300a to surround the chip connection terminals 130. For example, the underfill layer 135 may include epoxy resin formed using a capillary underfill process.

Figure 8A:
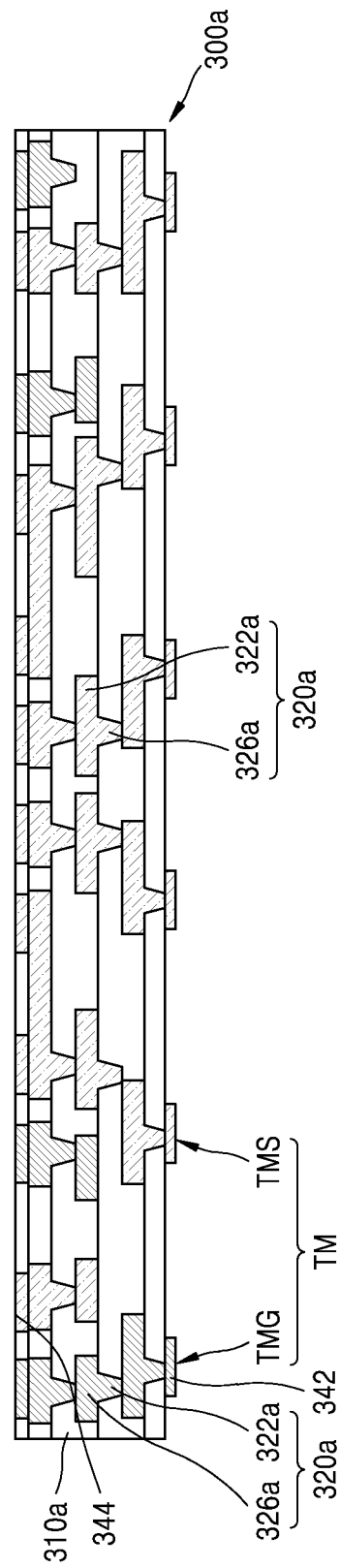
FIGS. 8A and 8B are cross-sectional views of stages in a method of manufacturing a semiconductor package, according to example embodiments.
Figure 8B:
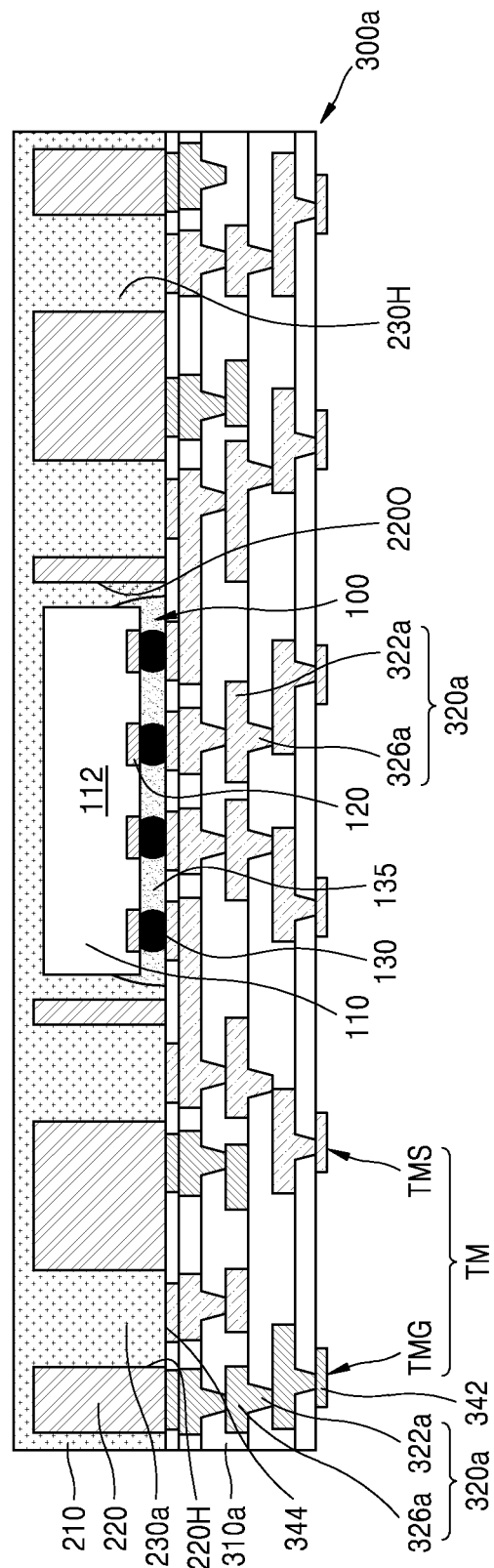

FIGS. 8A and 8B are cross-sectional views of stages in a method of manufacturing a semiconductor package, according to example embodiments.

Referring to FIG. 8A, the supporting wiring structure 300a is formed. While the supporting wiring structure 300 in FIG. 2D is formed on the semiconductor chip 100, the dielectric filling member 210, and the frame 220, the supporting wiring structure 300a of FIG. 8A may be formed before the semiconductor chip 100, the dielectric filling member 210, and the frame 220 are formed.

Referring to FIG. 8B, the frame 220 is attached to the supporting wiring structure 300a, and the semiconductor chip 100 is attached to the supporting wiring structure 300a through the mounting space 2200 of the frame 220 with the chip connection terminals 130 between the semiconductor chip 100 and the supporting wiring structure 300a. The underfill layer 135 is formed between the semiconductor chip 100 and the supporting wiring structure 300a to surround the chip connection terminals 130, and the dielectric filling member 210 is formed to fill the through holes 220H and the mounting space 220O and to cover the top surface of the frame 220. In some embodiments, the underfill layer 135 may not be formed, and the dielectric filling member 210 may be formed to surround the chip connection terminals 130.

Thereafter, the expansion conductive layer 252P in FIG. 2E may be formed on the dielectric filling member 210, and the semiconductor package 2 of FIG. 7 may be formed referring to the method described with reference to FIGS. 2F through 2H.

Figure 9:
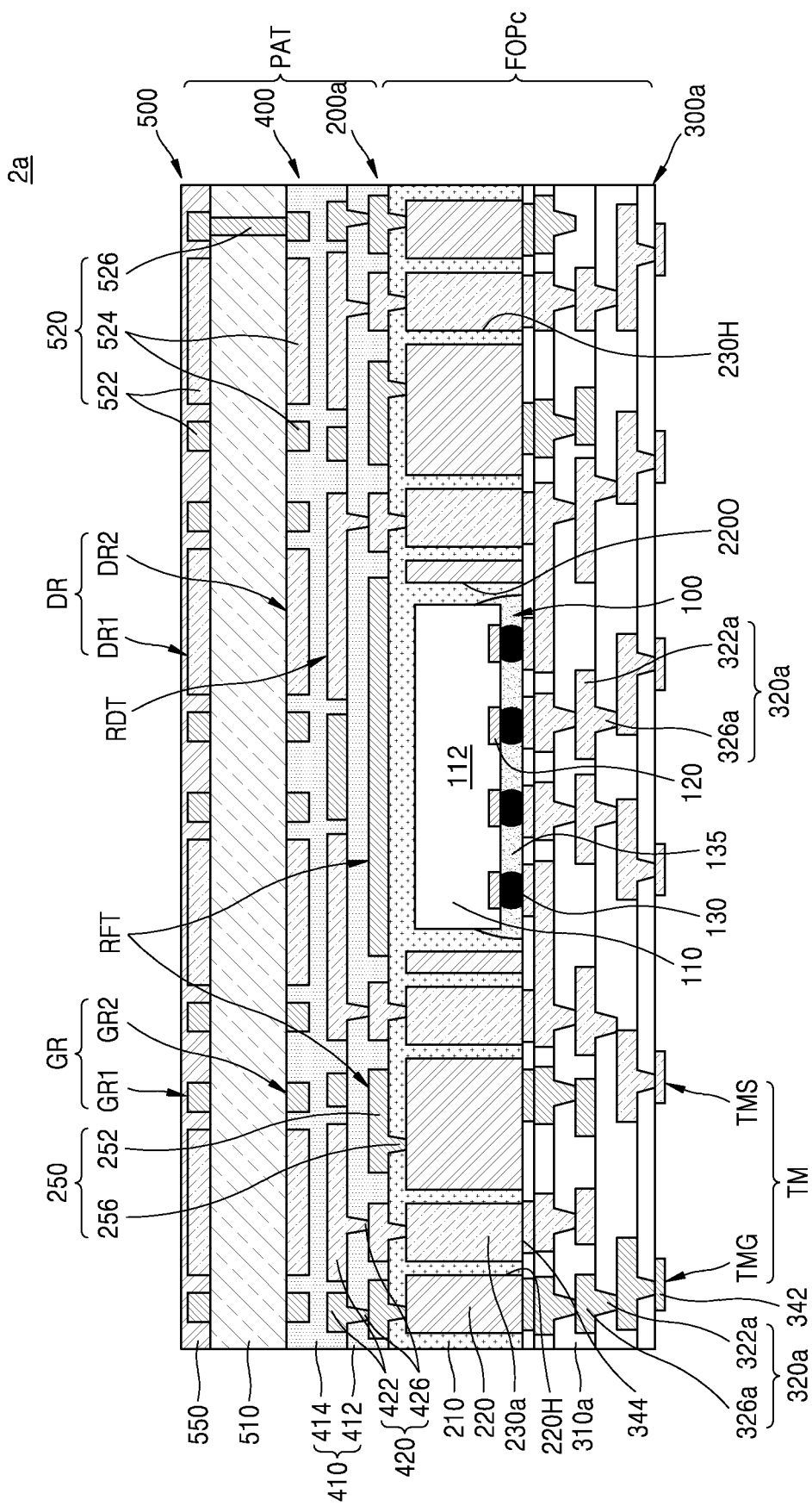
FIG. 9 is a cross-sectional view of a semiconductor package, according to example embodiments.

FIG. 9 is a cross-sectional view of a semiconductor package according to example embodiments. In FIGS. 3, 7, and 9, like numerals denote like elements, and redundant description may be omitted.

Referring to FIG. 9, a semiconductor package 2a may include a fan-out package part FOPc and the antenna part PAT. The fan-out package part FOPc may include the semiconductor chip 100. The semiconductor package 2a may include the supporting wiring structure 300a, the expansion layer 200a on the supporting wiring structure 300a, the semiconductor chip 100 in the expansion layer 200a, the cover wiring structure 400 on the semiconductor chip 100 and the expansion layer 200a, and the antenna structure 500 on the cover wiring structure 400.

The expansion layer 200a may include the dielectric filling member 210, the frame 220, the connection structures 230a, and the expansion conductive structure 250. In other words, the expansion layer 200a in FIG. 9 may include the connection structures 230a instead of the connection structures 230 included in the expansion layer 200 in FIG. 7.

While the inventive concept has been particularly shown and described with reference to example embodiments thereof, it will be understood that various changes in form and details may be made therein without departing from the spirit and scope of the following claims.

What is claimed is:

1. A method of manufacturing a semiconductor package, the method comprising:
   forming a structure including a frame, a semiconductor chip, and a dielectric filling member, the frame including a conductive material and having a mounting space and a plurality of through holes, the semiconductor chip located in the mounting space, and the dielectric filling member filling the mounting space and the plurality of through holes and covering a top surface of the frame;
   forming a supporting wiring structure under the structure, the supporting wiring structure including a first redistribution dielectric layer and a first redistribution conductive structure, the first redistribution conductive structure being electrically connected to the semiconductor chip;
   forming a plurality of connection structures through the dielectric filling member, the plurality of connection structures extending in the plurality of through holes, electrically connecting the first redistribution conductive structure, and including a material having a higher electrical conductivity than the conductive material of the frame;
   forming a cover wiring structure on the structure, the cover wiring structure including a second redistribution dielectric layer and a second redistribution conductive structure; and
   attaching an antenna structure including a base board layer and an antenna conductive structure to the cover wiring structure.

2. The method as claimed in claim 1, wherein the forming the structure includes:
   attaching the frame to a first supporting member;
   attaching the semiconductor chip to the first supporting member through the mounting space, a bottom surface of the frame being at a same vertical level as a bottom surface of the semiconductor chip, and a top surface of the semiconductor chip being at a lower vertical level than the top surface of the frame; and
   forming the dielectric filling member covering a side surface and the top surface of the semiconductor chip,
   wherein the semiconductor chip includes a semiconductor substrate, a semiconductor device at an active side of the semiconductor substrate, and chip connection pads on the active side of the semiconductor substrate, and
   wherein the active side of the semiconductor substrate faces the first supporting member.

3. The method as claimed in claim 2, further comprising:
   preparing an expansion conductive layer attached on a second supporting member;
   removing the first support member from the structure; and
   attaching the structure to the expansion conductive layer,
   wherein the active side of the semiconductor substrate faces the supporting wiring structure.

4. The method as claimed in claim 3, further comprising:
   forming an expansion conductive structure including a plurality of expansion conductive patterns on a top surface of the dielectric filling member, and a plurality of expansion vias through the dielectric filling member, the plurality of expansion vias electrically connecting some of the plurality of expansion conductive patterns to the frame,
   wherein the plurality of expansion conductive patterns are formed by patterning the expansion conductive layer.

5. The method as claimed in claim 4, wherein at least some of the plurality of expansion conductive patterns include ground planes.

6. The method as claimed in claim 5, wherein the at least some of the plurality of expansion conductive patterns overlap an entire top surface of the semiconductor chip in a vertical direction, the at least some of the plurality of expansion conductive patterns corresponding to the ground planes.

7. The method as claimed in claim 1, wherein a portion of the frame adjacent to the plurality of through holes and a portion of the dielectric filling member surrounds each of the plurality of connection structures in a ring shape.

8. The method as claimed in claim 1,
   wherein the antenna structure and at least a portion of the cover wiring structure form a patch antenna,
   wherein the antenna conductive structure includes a plurality of antenna top conductive patterns on a top surface of the base board layer, and a plurality of antenna bottom conductive patterns on a bottom surface of the base board layer, and
   wherein some of the plurality of antenna top conductive patterns and some of the plurality of antenna bottom conductive patterns form a director of the patch antenna, the director including a first director and a second director facing the first director with the base board layer between the first director and the second director.

9. The method as claimed in claim 8, wherein other antenna top conductive patterns of the plurality of antenna top conductive patterns form a first guard ring, and other antenna bottom conductive patterns of the plurality of antenna bottom conductive patterns form a second guard ring, the first guard ring being separated from the first director and surrounding the first director, and the second guard ring being separated from the second director and surrounding the second director.

10. The method as claimed in claim 8,
wherein the second redistribution conductive structure includes a plurality of second redistribution line patterns and a plurality of second redistribution vias at least partially passing through the second redistribution dielectric layer,
wherein some of the plurality of second redistribution line patterns form a radiator of the patch antenna, the radiator overlapping the director in a vertical direction and being electrically connected to the connection structures through some of the plurality of second redistribution vias, and
wherein others of the second redistribution line patterns are connected to the frame through others of the second redistribution vias.

11. The method as claimed in claim 10, wherein the frame is grounded.

12. A method of manufacturing a semiconductor package, the method comprising:
attaching a frame to a first supporting member, the frame including a conductive material and having a mounting space and a plurality of through holes;
attaching a semiconductor chip to the first supporting member through the mounting space, the semiconductor chip including a semiconductor substrate, a semiconductor device at an active side of the semiconductor substrate, and chip connection pads on the active side of the semiconductor substrate, and the active side of the semiconductor substrate facing the first supporting member;
forming a dielectric filling member filling the mounting space and the plurality of through holes and covering a top surface of the frame, a side surface of the semiconductor chip, and a top surface of the semiconductor chip;
forming a supporting wiring structure on a structure, the structure including the frame, the semiconductor chip, and the dielectric filling member, the supporting wiring structure including a first redistribution dielectric layer and a first redistribution conductive structure electrically connected to the semiconductor chip, and the active side of the semiconductor substrate faces the supporting wiring structure;
forming a plurality of connection structures through the dielectric filling member, the plurality of connection structures extending in the plurality of through holes, electrically connecting the first redistribution conductive structure;
forming a cover wiring structure on the structure, the cover wiring structure including a second redistribution dielectric layer and a second redistribution conductive structure; and
attaching an antenna structure including a base board layer and an antenna conductive structure to the cover wiring structure.

13. The method as claimed in claim 12, further comprising:
preparing an expansion conductive layer attached on a second supporting member;
removing the first support member from the structure;
attaching the structure to the expansion conductive layer; and
forming an expansion conductive structure including a plurality of expansion conductive patterns on a top surface of the dielectric filling member, and a plurality of expansion vias through the dielectric filling member, the plurality of expansion vias electrically connecting some of the plurality of expansion conductive patterns to the frame,
wherein the plurality of expansion conductive patterns are formed by patterning the expansion conductive layer.

14. The method as claimed in claim 12, wherein a bottom surface of the frame is at the a same vertical level as a bottom surface of the semiconductor chip, and the top surface of the semiconductor chip is at a lower vertical level than the top surface of the frame.

15. The method as claimed in claim 12, wherein each of the plurality of connection structures, a portion of the frame adjacent to the plurality of through holes, and a portion of the dielectric filling member form a signal transmission line having a coaxial structure, the portion of the dielectric filling member being between each of the plurality of connection structures in the plurality of through holes and the frame and surrounding each of the plurality of connection structures in a ring shape.

16. The method as claimed in claim 12,
wherein the side surface of the semiconductor chip is separated from an inner side surface of the mounting space, and
wherein the dielectric filling member fills a space between the semiconductor chip and the inner side surface of the mounting space.

17. The method as claimed in claim 12, wherein each of the plurality of connection structures includes a material having a higher electrical conductivity than a material of the frame.

18. The method of claim 12,
wherein the antenna structure and at least a portion of the cover wiring structure form a patch antenna, and
wherein the patch antenna includes a director, a radiator, and a reflector, the director including a first director and a second director facing the first director with the base board layer between the first director and the second director, the radiator overlapping the director in a vertical direction and being electrically connected to the plurality of connection structures, and the reflector being grounded and overlapping the semiconductor chip in the vertical direction.

19. A method of manufacturing a semiconductor package, the method comprising:
attaching a frame to a first supporting member, the frame including a conductive material and having a mounting space and a plurality of through holes;
attaching a semiconductor chip to the first supporting member through the mounting space, the semiconductor chip including a semiconductor substrate, a semiconductor device at an active side of the semiconductor substrate, and chip connection pads on the active side of the semiconductor substrate, and the active side of the semiconductor substrate facing the first supporting member;

forming a dielectric filling member filling the mounting space and the plurality of through holes and covering a top surface of the frame, and a top surface of the semiconductor chip;

preparing an expansion conductive layer attached on a second supporting member;

removing the first support member from a structure, the structure including the frame, the semiconductor chip, and the dielectric filling member;

attaching the structure to the expansion conductive layer, the expansion conductive layer contacting the dielectric filling member;

forming a supporting wiring structure on the structure, the supporting wiring structure including a first redistribution dielectric layer and a first redistribution conductive structure electrically connected to the semiconductor chip, and the active side of the semiconductor substrate faces the supporting wiring structure;

forming a plurality of connection structures through the dielectric filling member, the plurality of connection structures extending in the plurality of through holes, electrically connecting the first redistribution conductive structure;

forming a cover wiring structure on the structure, the cover wiring structure including a second redistribution dielectric layer and a second redistribution conductive structure; and attaching an antenna structure to the cover wiring structure, the antenna structure forming a patch antenna together with at least a portion of the cover wiring structure.

20. The method as claimed in claim 19, further comprising:

wherein the patch antenna includes a plurality of directors, a plurality of radiators, and a reflector, the plurality of directors including a first director and a second director facing the first director with a base board layer between the first director and the second director, the plurality of radiators overlapping the plurality of directors in a vertical direction and being electrically connected to the plurality of connection structures, and the reflector being grounded and overlapping the semiconductor chip in the vertical direction.

* * * * *